United States Patent [19]
Kumagai et al.

[11] Patent Number: 5,508,256
[45] Date of Patent: Apr. 16, 1996

[54] OXIDE HIGH-TEMPERATURE SUPERCONDUCTING MATERIAL, METHOD OF PREPARING SAME AND SUPERCONDUCTING WIRES

[75] Inventors: Teruo Kumagai, Ibaraki; Tsuneyuki Kanai, Hitachi; Atsuko Soeta, Mito; Takaaki Suzuki; Kazutoshi Higashiyama, both of Katsuta; Tomoichi Kamo; Shinpei Matsuda, both of Ibaraki; Kunihiro Maeda, Hitachi; Akira Okayama, Hitachi; Hideyo Kodama; Akira Yoshinari, both of Katsuta; Yoshimi Yanai, Hitachi, all of Japan

[73] Assignee: Hitachi, Ltd., Tokyo, Japan

[21] Appl. No.: 264,767

[22] Filed: Jun. 23, 1994

Related U.S. Application Data

[63] Continuation of Ser. No. 958,604, Oct. 13, 1992, abandoned, which is a continuation of Ser. No. 618,981, Nov. 28, 1990, abandoned, which is a continuation-in-part of Ser. No. 315,309, Feb. 24, 1989, abandoned.

[30] Foreign Application Priority Data

Feb. 26, 1988 [JP] Japan .................................. 63-42047
Mar. 2, 1988 [JP] Japan .................................. 63-47474
Apr. 12, 1988 [JP] Japan .................................. 63-89422

[51] Int. Cl.$^6$ ............................. H01B 12/00; H01L 39/12
[52] U.S. Cl. ...................... 505/450; 505/100; 505/124; 505/729; 505/740; 505/776; 505/780; 505/782; 505/737; 505/452; 252/518; 252/521; 423/593
[58] Field of Search .................... 252/518, 521; 423/593; 505/100, 729, 740, 776, 780, 782, 124, 737

[56] References Cited

U.S. PATENT DOCUMENTS 3,772,090 11/1973 Allen et al. ........................ 148/11.5 F
4,921,834 5/1990 Hasegawa ................................ 505/1
5,039,653 8/1991 Jackson et al. ..................... 505/729

FOREIGN PATENT DOCUMENTS 0336621 10/1989 European Pat. Off. .
1235512 4/1985 Japan .................................... 505/1
2918553 11/1988 Japan .
643049 1/1989 Japan .

OTHER PUBLICATIONS

Advanced Ceramic Materials–Ceramic Superconductors, vol. 2, No. 3B, Jul., 1987, pp. 457–470, ACerS, Westerville, OH, US I. W. Chen, et al "Superconductivity and the tailoring of lattice parameters of the compound . . .".

Japanese Journal of Applied Physics/Part 2, Letters, vol. 27, No. 2, Feb., 1988, pp. L185–L187.

M. Okada, et al "Fabrication of Ag-sheathed Ba–Y–Cu oxide superconductor tape" Feb. 1988.

Advanced Ceramic Materials–Ceramic Superconductors, vol. 2, No. 3B, Jul. 1987, pp. 388–400, ACerS, Westerville, OH, US, R. W. McCallum, et al "Problems in the production of YBa2CU3Ox superconducting wire".

(List continued on next page.)

Primary Examiner—Paul Lieberman
Assistant Examiner—M. Kopec
Attorney, Agent, or Firm—Antonelli, Terry, Stout & Kraus

[57] ABSTRACT

A method of producing a high-temperature oxide superconducting material, which comprises the steps of (a) preparing a material corresponding to an oxide superconductor of the perovskite type structure consisting essentially of a first member selected from the group consisting yttrium, lanthanoids, thallium and bismuth; at least one alkaline earth metal; copper; and oxygen and (b) heating the material in the presence of an alkali metal selected from the group consisting of potassium, sodium, rubidium and cesium to a temperature around the melting point of the alkali metal or to a higher temperature for a time sufficient to effect grain growth in the superconductor material, thereby to produce the superconductor containing the alkali metal in an amount not larger than 4 mole % based on the first member.

10 Claims, 14 Drawing Sheets

30μm

OTHER PUBLICATIONS

Z. Phys. B Condensed Matter 64, 189–193 (1986) No Month Available.

Physical Review Letters, vol. 58, No. 9, Mar. 1987, pp. 908–910.

Japanese Journal of Applied Physics, vol. 26, No. 4, Apr. 1987, pp. L 314–L 315.

Journal of the Japan Metal Society, vol. 26, No. 10, 1987, p. 971 No Month Available.

Japanese Patent No. 57–118002 Jul. 1982 Kokai (Laid Open).

Japanese Journal of Applied Physcis, vol. 26, 1987, p. L. 10/1645.

Saito et al., "High Tc Superconducting Properties in YTl-BaCuO, YBaKCuO and YBaCuMgO", Physica 148B, 1987, pp. 336–338.

Okada "Fabrication of Ag–Sheathed Ba–Y–Cu Oxide Superconductor . . . " *Jpn. Jnl. Appl. Phys. Lett.* vol. 27(2) Feb., 1988 pp. L185–L187.

Jin "High Tc superconductors—composite wire fabrication" *Appl. Phys. Lett. vol. 51(3)* Jul. 20, 1987 pp. 203–204.

Jin "Processing for high–critical currents in $YBa_2Cu_3O$" *MRS: Extended Abstracts: Superconduct. III* Apr. 5–9, 1988 pp. 153–156.

Jin "Melt textured growth of polycrystalline $YBa_2Cu_3O_2$ . . . " *Phys. Rev. B* vol. 37(13) May 1, 1988 pp. 7850–7853.

Franck "Superconductivity in Systems of composition . . ." *Rev. of Solid State Sci vol. 1* (2) 1987 pp. 405–410.

Suzuki "Superconducting transition temperature in the $(YBa_2Cu_3O_{7-\delta})$ . . . " *J. Material Sci Lett.* vol. 7(9) 1988 pp. 926–927.

Strobel "Superconducting Properties of Sunbstituted $Yba_2Cu_{3-\delta}M_{3x}O_7$" *Solid State Comm. v. 65(7)* 1988 (Feb.) pp. 585–589.

Yuhuan "High–Tc Superconductivity and Structure of . . . " *Int. Jnl. Med. Phys.* vol. 1 No. 2 1987 pp. 253–256.

Jiang "Crystal Growth of Y–Ba–Cu–O compound by laser . . . " *Ext. Abstracts: High Temp Super. II* MRS) Apr. 5–9, 1988, pp. 125–128.

Kilcoyne "Improving inter–grain contact in high–Tc Superconducting . . . " *J. of Physics D* Oct. 14, 1987 pp. 1327–1329.

Varadavaju "Effect of Chemical Substitution on the . . . $Yba_2Cu_3O_7$," *Physica 148B* 1987 pp. 417–418.

Jung "Effect of Substitution of Bi, Ga, and Fe on . . . $YBa_2Cu_3O_7$," *Phys. Rev. B* vol. 37(13) May 1, 1988 pp. 7510–7515.

Ausloos "Effects of Alkali Cation (Li, Na, K, Cs) . . . of $YBa_2Cu_3O_7$ . . . " *Solid State Comm.* v. 68(6) 1988 pp. 539–545.

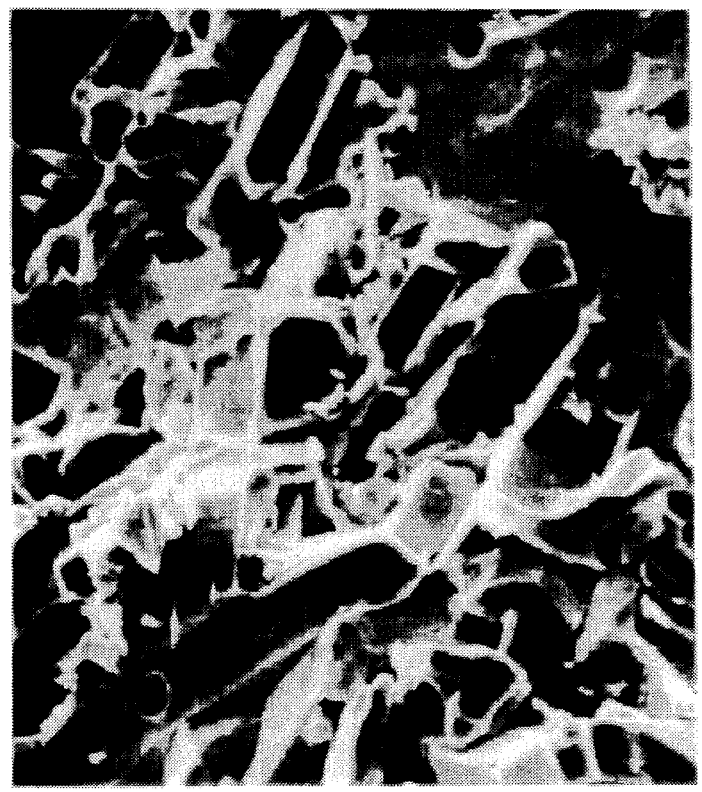
F I G. 1(a)
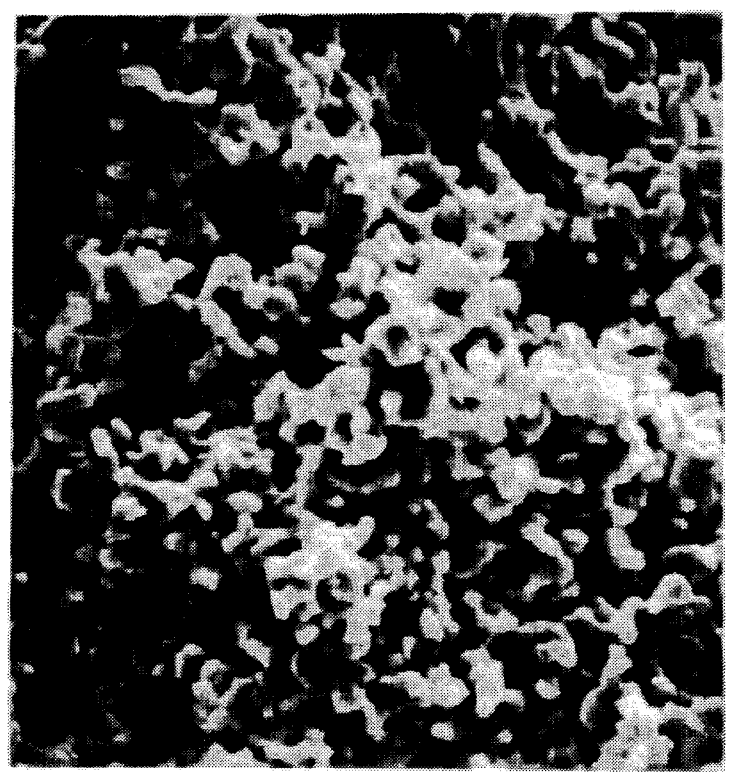
F I G. 1(b)

F I G. 5(a)
60μm
F I G. 5(b)
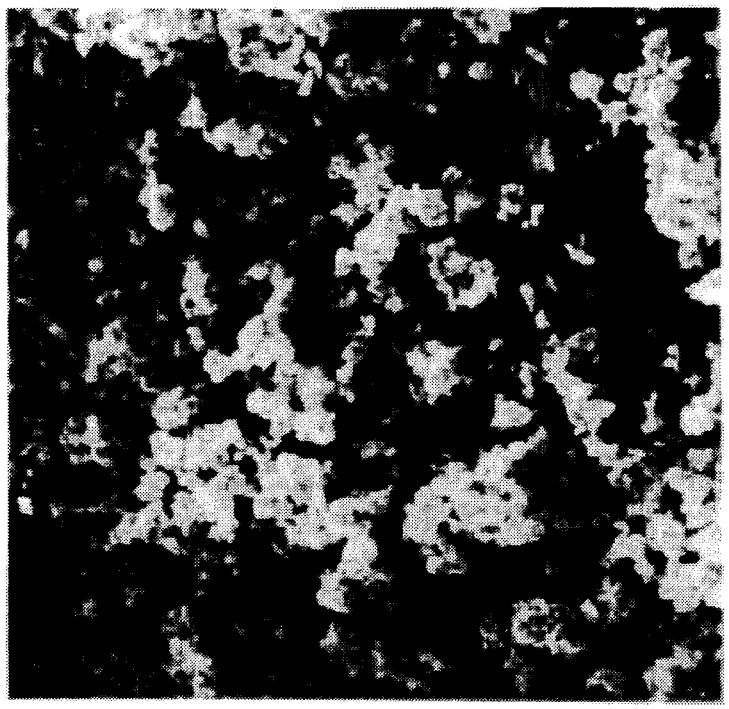
60μm

30μm

30μm

30μm

30μm

30μm

OXIDE HIGH-TEMPERATURE SUPERCONDUCTING MATERIAL, METHOD OF PREPARING SAME AND SUPERCONDUCTING WIRES

This application is a Continuation application of application Ser. No. 958,604, filed Oct. 13, 1992, which application is a Continuation application of application Ser. No. 618,981, filed Nov. 28, 1990, (now abandoned), which application is Continuation-In-Part application of application Ser. No. 315,309, filed Feb. 24, 1989 (now abandoned).

BACKGROUND OF THE INVENTION

1. Field of the Invention

The Present invention relates to an oxide high-temperature superconducting material, more particularly to an oxide high-temperature superconducting powdery or crystalline material having an excellent orientability, a superconducting wire made from the powdery or crystalline material and having an improved critical current density, and a method of preparing the material and a method of preparing the wire.

2. Related Art

Applications of superconductive materials are in general classified into two fields: a heavy electric engineering field suitable for high current and strong magnetic field; and a light electric engineering field suitable for low current or low voltage.

Most of prior superconductors are not practically applied. As materials for superconducting wires are known intermetallic compounds such as $Nb_3Sn$, $Nb_3Ge$, a Nb-Ti alloy and etc. These compounds have a low temperature of exhibiting superconductivity, socalled critical temperature Tc. The highest critical temperature is 23 K for $Nb_3Ge$. Liquid helium (4.2 K) is needed for cooling $Nb_3Ge$.

Recently, oxide superconducting substances having a high critical temperature Tc have been found, for example, a La-Sr-Cu oxide (35–40 K) and Y-Ba-Cu oxide (90–100 K) and Bi-Sr-Ca-Cu oxide (70–100 K). The critical temperature of this Y-Ba-Cu oxide, Ba-Sr-Ca-Cu oxide and Tl-Ba-Ca-Cu oxide are much higher than the temperature of liquid nitrogen (77 K). Thus, expensive liquid helium used for cooling the prior intermetallic compounds is not necessary to use for cooling the Y-Ba-Cu oxide, Bi-Sr-Ca-Cu and Tl-Ba-Ca-Cu. That is, the Y-Ba-Cu, Bi-Sr-Ca-Cu and Tl-Ba-Ca-Cu oxide can exhibit superconductivity with inexpensive liquid nitrogen. Therefore, the Y-Ba-Cu, Bi-Sr-Ca-Cu and Tl-Ba-Ca-Cu oxide has been noted as practical superconducting substances and demanded to be put into practical use. As high-temperature superconducting substances having a much higher superconducting transition temperature than that of prior superconducting substances, a lanthanum-barium-copper oxide was discovered by Dr. J. G. Bednorz and Dr. K. A. Mdller in the beginning of 1986 (see Z. Phys. B Condesed Matter 64, 1986, pp. 189–193), and then an yttrium-bariumcopper oxide (referred to as Y-Ba-Cu oxide) discovered by Dr. Chu of Houston University, U.S.A., in the spring of 1987 (see Physical Review Letters, Vol. 58, No. 9, 1987, pp. 908–910) and at the same time.also in Japan (see Japanese Journal of Applied Physics, Vol. 26, No. 4, 1987, pp. L314–L315). Now intensive researches and developments have been made on a basic science about compositions, crystal structures, properties and theory of the superconducting substances, on the synthesis and applications to heavy or light electric engineering fields of superconducting substances, and further on survey of materials having superconductivity at a higher temperature, e.g., room temperature.

Among techniques to be researched and developed, a technique of making wires from the superconducting substances is important as an elemental technique in applications to the heavy electric engineering for superconductive magnets or etc.

In one of the most general methods of making wires or ribbons from Y-Ba-Cu, Bi-Sr-Ca-Cu and Tl-Ba-Ca-Cu oxide, a metal sheath is filled with an Y-Ba-Cu, Bi-Sr-Ca-Cu and Tl-Ba-Ca-Cu oxide powder and worked by a swaging machine or drawbench to be formed in the wire or by a roll machine to be formed in the ribbons. The wires or ribbons are fired at about 900° C. for a few hours to sinter the Y-Ba-Cu oxide powder which otherwise will not form any current path therein, thereby allowing the particles to diffuse in each other so that the current path can be formed. In case of Bi-Sr-Ca-Cu-O firing is preferably performed at about 1,845° C.; and in case of Tl-Ba-Ca-Cu-O firing is preferably performed at about 835° C.

The thus obtained superconductors has a perovskite type layer crystal structure. This structure of the Y-Ba-Cu oxide superconductor is schematically illustrated in FIG. 2 attached hereto. In FIG. 2, 1 is yttrium, 2 barium, 3 copper, 4 oxygen and 5 oxygen (vacant). Electric current flows on the layer of crystal, that is, electron can easily flow on the a axis-b axis plane of crystal (see Journal of the Japan Metal Society, Vol. 26. No. 10, 1987, p. 971).

Therefore, it is important to align crystals so that the a axis-b axis planes of the crystals orient to the longitudinal direction of the wire. Bi-Sr-Ca-Cu-O and Tl-Ba-Ca-Cu-O have similar crystalline structures to that of Y-Ba-Ca-Cu-O. In order to attain a high Jc, it is necessary to orient a axis-b axis face.

From the viewpoint of this orientation, a melt-quenching method (see Symposium of Superconducting Substance Chemistry, October, 1987) and a chemical vapor depositing method (see Japanese Patent Application No. 57-118002) have been studied on. For example, a thin superconducting film having an excellent orientability has already been obtained by the chemical vapor depositing method. Such thin superconducting film has a high critical current density Jc of $10^3$ $A/cm^2$ generally required. However, this method cannot produce a long film or wire.

The metal superconducting material is relatively easily drawn in a wire but, on the other hand, the oxide superconducting material is poor in ductility and hardly formed in wires. Therefore, for making wires from the oxide superconducting material it is necessary to fill a metal pipe with a powder of the oxide superconducting material, draw the pipe and heat treat the drawn pipe to sinter the oxide superconducting material. However, as mentioned above, this oxide superconducting material taking the perovskite type crystal structure is anisotropic in the electric current-flowing direction. Furthermore, since this oxide has a layer structure, the crystal particles are in a plate form and hardly aligned in a direction as compared with the thin film. Therefore, current hardly flows between the particles, which prevents the critical current density Jc from being raised up. Furthermore, the orientation of crystals has not been taken into account in prior art. Therefore, crystal grains of the Y-Ba-Cu oxide grow at random and they are not oriented, so that low critical current density is obtained.

The critical current density at the temperature of liquid nitrogen (77 K) of the Y-Ba-Cu oxide produced by prior methods is now about 2,000 $A/cm^2$ as reported in Nikkan Kogyo Shimbun dated October 7, 1987.

SUMMARY OF THE INVENTION

The first object of the present invention is to provide a high-temperature oxide superconducting article containing crystals improved in orientability so that the article has a high critical current density Jc.

The second object of the present invention is to provide powdery raw materials for a high-temperature oxide superconducting material.

The third object of the present invention is to provide a method of preparing each of the above-mentioned article and powdery raw materials.

The fourth object of the present invention is to provide a method of aligning particles of the superconducting oxide materials in a predetermined direction.

The present invention provides a method of producing a high-temperature oxide superconducting material, which comprises the steps of:

a) preparing a material corresponding to an oxide superconductor of the perovskite type structure consisting essentially of a first member selected from the group consisting of yttrium, lanthanoids, thallium and bismuth; at least one alkaline earth metal; copper; and oxygen; and b) heating the material in the presence of an alkali metal selected from the group consisting of potassium, sodium, rubidium and cesium to a temperature around the melting point of the alkali metal or to a higher temperature for a time sufficient to effect grain growth in the superconductor material, thereby to produce a superconductor containing the alkali metal in an amount not larger than 4 mole % based on the first member. It will be understood that "lanthanoids" are defined as being yttrium and elements of atomic number 57 to 71.

In the above method, preferable superconductor materials are Ln-Ba-Cu oxide, Y-Ba-Cu oxide, Bi-Sr-Ca-Cu oxide and Tl-Ba-Ca-Cu oxide, where Ln means lanthanoids. The present invention is specifically applied to such superconductor materials as $YBa_2Cu_3O_{7+\delta}$, $Bi_2Sr_2Ca_1Cu_2O_{8+\delta}$, $Bi_2Sr_2Ca_2Cu_3O_{10+\delta}$, $Tl_2Ba_2Ca_1Cu_2O_{8+\delta}$, $Tl_2Ba_2Ca_2Cu_3O_{10+\delta}$, $Tl_1Ba_2Ca_1Cu_2O_{6.5+\delta}$ and $Tl_2Ba_2Ca_2Cu_3O_{8.5+\delta}$, where $\delta$ is 0.5.

The oxide superconductor produced by the method of the present invention is free from or contains only small amounts of the alkali metal. According to the conventional analytical techniques, alkali metal atoms were not detected or detected as trace, in case of potassium and sodium. On the other hand, the oxide superconductor produced in the presence of rubidium or cesium contained rubidium or cesium of less than 4 mole % based on the first member.

In another aspect of the present invention, there is provided a method of producing a high-temperature oxide superconducting material, which comprises the steps of:

a) preparing a mixture of materials corresponding to an oxide superconductor of the perovskite type structure comprising a first member selected from the group of a yttrium compound, a lanthanoid compound, a thallium compound and a bismuth compound, an alkaline earth metal compound, a copper compound, and an alkali metal compound selected from the group consisting of a potassium compound, a sodium compound, a rubidium compound and a cesium compound; and b) heating the mixture to a temperature so as to convert the mixture into the superconductor of the perovskite type structure consisting essentially of the first member, the alkaline earth metal, copper and oxygen for a time sufficient to effect grain growth in the superconductor material, thereby to produce the superconductor containing the alkali metal in an amount not larger than 4 mole % based on the first member of the superconductor. The amount of an alkali metal salt present during the heating step (b), i.e. added in step (a) is in the range of 0.01 to 10 mols, preferably 0.05 to 0.5 mols per mol of an oxide superconducting law material.

In the above method, the oxide superconductor material is prepared by converting a mixture comprising Y compound or a rare earth metal (lanthanoid) compound, an alkaline earth metal compound, a copper compound and an alkali metal compound into the oxide superconductor consisting essentially of the first member, the alkaline earth metal, copper and oxygen. Even in this process, only a very small amount of the alkali metal is contained in the superconductor or substantially no alkali metal is contained.

When a composite superconductor comprising the superconductor and an electrical conductor in contact with the superconductor is desired, the above mentioned method further comprises the steps of:

pulverizing the resulting superconductor material having been subjected to the heat treatment in the presence of the alkali metal;

packing the resulting powder of the superconductor in a hollow tube of a electrical conductor material;

drawing the packed superconductor together with the tube thereby to reduce the sectional area of the tube and to enlarge its length; and firing the resulting composite of the superconductor and the electrical conductor material in an oxidative atmosphere or in an inert atmosphere.

The heating temperature and heating time for effecting grain growth are chosen from 900° to 960° C. for 1 to 50 hours in case of Y series oxide superconductors; 800° to 880° C. for 1 to 50 hours in case of Bi series oxide superconductors and 700° to 850° C. for 1 to 50 hours in case of Tl series oxide superconductors.

The relative amounts of the first member, the at least one alkaline earth metal, the copper, and the oxygen are expressed as being an atomic ratio of 0.5–23:1–5:1–4:3–12. The structure which the superconducting material can take in the special atomic ratio ranges is explained below. That is, when the atomic ratio of the first member is less than 1, the superconducting material takes a one-layer structure containing thallium or bismuth, or either a one- or two-layer structure containing yttrium or a lanthanoid, and when the atomic ratio of the first member exceeds 2, the superconducting material takes a two-layer structure containing thallium or bismuth; and when the atomic ratio of the alkaline earth metal is less than 2, the first member is yttrium or lanthanoids; and when the atomic ratio of the alkaline earth metal exceeds 4, the superconducting material takes a one- or two-layer structure of thallium or bismuth.

The heating temperature is within the range from the alkali salt-decomposing temperature to the layered perovskite-decomposing temperature, i.e. 400° to 1,100° C., desirably 700° to 1,000° C.; the particle size is within the range from several tens to several hundreds of micron on average; the time needed for grain growth is 1 to 50 hours; and the extent of drawing is such that the reduction ratio of the cross-sectional area of a drawn wire to the cross-sectional area of the original composite is in the range of 0.5 to 10%, or such that the composite is several times drawn and desirably rolled to be in a tape or ribbon form.

BRIEF DESCRIPTION OF DRAWINGS

FIGS. 1(a) and 1(b) are electron microphotographs showing the shape of particles in articles made of high-temperature oxide superconducting powdery materials in an embodiment of the present invention and a comparative example, respectively.

FIGS. 5(a) and 5(b) are electron microphotographs showing the shape of particles in articles made of high-temperature oxide superconducting powdery materials in a further example of the present invention and a comparative example, respectively.

DETAILED DESCRIPTIONS OF THE INVENTION

In order to achieve the objects as mentioned above, the present inventors considered that the oxide superconducting powdery material charged in a metal sheath should have an excellent orientability to a longitudinal direction of a wire or ribbon when the material is drawn or rolled in the wire or ribbon. As a result of their study, they have found that the orientation of crystals can be made easy by heat treating the oxide in the presence of at least one element selected from the group of alkali metals.

In accordance with the present invention, the high-temperature oxide superconducting material having a composition of $LnBa_2CU_3O_x$, $Bi_2Sr_2Ca_1Cu_2O_8$, $Bi_2Sr_2Ca_2Cu_3O_{10}$, $Tl_2Ba_2Ca_1Cu_2O_8$, $Tl_2Ba_2Ca_2Cu_3O_{10}$, $Tl_1Ba_2Ca_1Cu_2O_{6.5}$ or $Tl_2Ba_2Ca_2Cu_3O_{8.5}$, wherein Ln is yttrium or a rare earth element and x is 6.5 to 7, for example, $YBa_2CU_3O_{7-\delta}$, $Bi_2Sr_2Ca_1Cu_2O_8$, $Bi_2Sr_2Ca_2Cu_3O_{10}$, $Tl_2Ba_2Ca_1Cu_2O_8$, $Tl_2Ba_2Ca_2Cu_3O_{10}$, $Tl_1Ba_2Ca_1Cu_2O_{6.5}$ or $Tl_2Ba_2Ca_2Cu_3O_{8.5}$ is synthesized in the presence of at least one element selected from the group of alkali metals and bismuth to thereby promote the growing of crystal grains. For incorporating the alkali metals into raw materials for the high-temperature oxide superconducting material, it is effective to apply salts of the alkali metals at a temperature of at least the melting point of the salt.

That is, for, for example, potassium, potassium carbonate has a melting point of 891° C. When the raw materials for the Y-Ba-Cu oxide superconducting material are synthesized in the potassium carbonate at 891° C. or higher, effective grain growing can be expected. In actual procedures in which the raw materials for the oxide superconducting material are subjected to solid phase diffusion in the presence of an alkali metal and/or bismuth at a temperature below the melting point of the raw materials. The addition of potassium is carried out by a powder mixing method, impregnating method or coprecipitating method to raw materials or the oxide of $YBa_2CU_3O_{7-\delta}$, $Bi_2Sr_2Ca_1Cu_2O_8$, $Bi_2Sr_2Ca_2Cu_3O_{10}$, $Tl_2Ba_2Ca_1Cu_2O_8$, $Tl_2Ba_2Ca_2Cu_3O_{10}$, $Tl_1Ba_2Ca_1Cu_2O_{6.5}$ or $Tl_2Ba_2Ca_2Cu_3O_{8.5}$. The potassium is added in the form of a compound such as potassium nitrate or carbonate. Then, the powder containing the potassium is shaped, heat treated and sintered.

Figure 2:
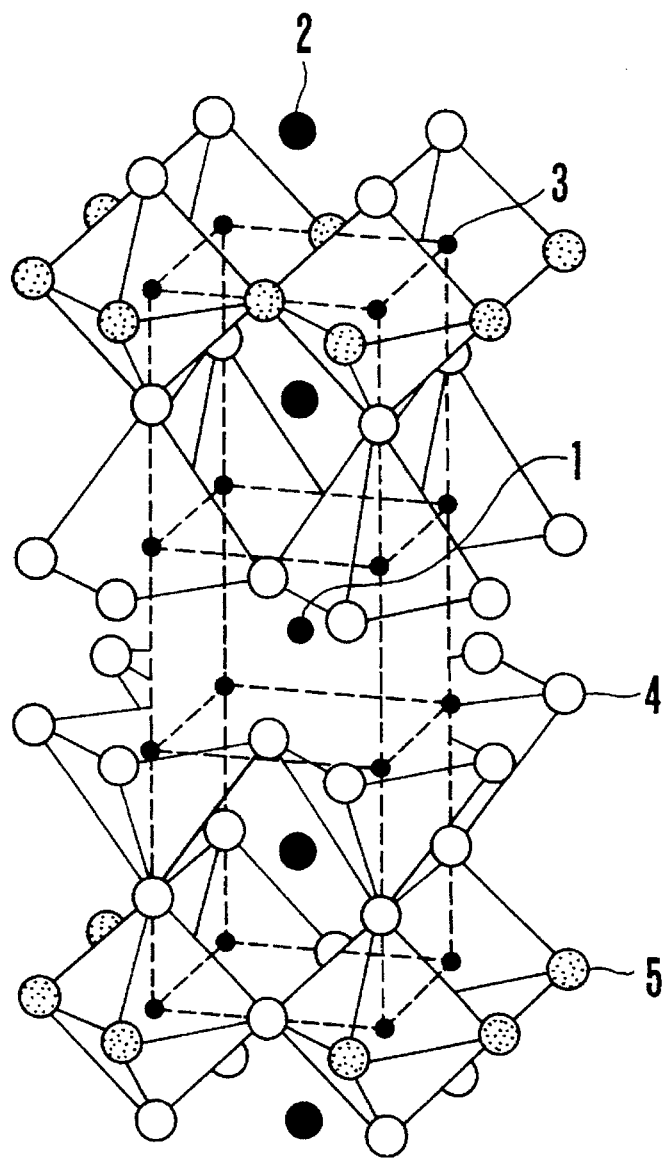
FIG. 2 is a schematical view of an oxygendeficient trilayer perovskite type structure of $YBa_2CU_3Oy$.
Figure 2:
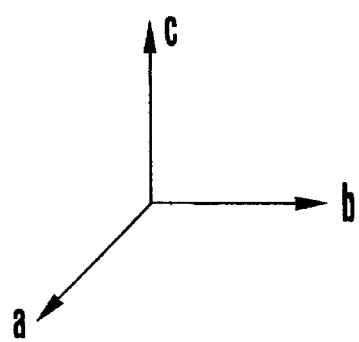
Figure 3A:
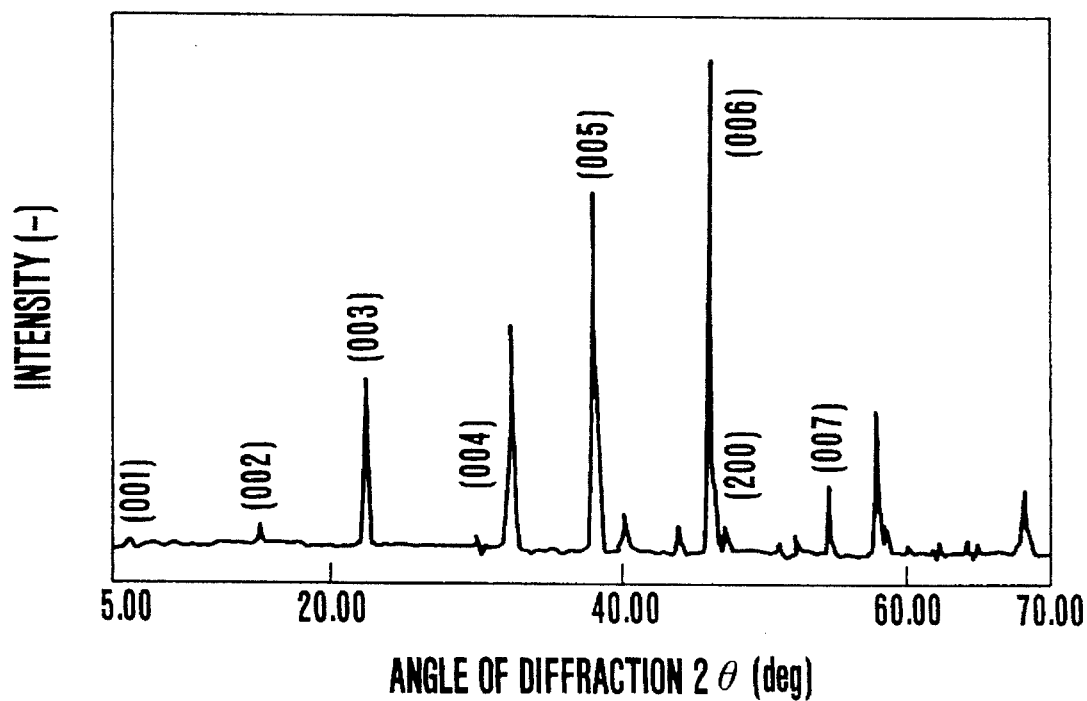
FIGS. 3(a) and 3(b) are X-ray diffraction patterns of shaped articles made of the oxide superconducting powdery materials in an embodiment of the present invention and a comparative example, respectively.
Figure 3B:
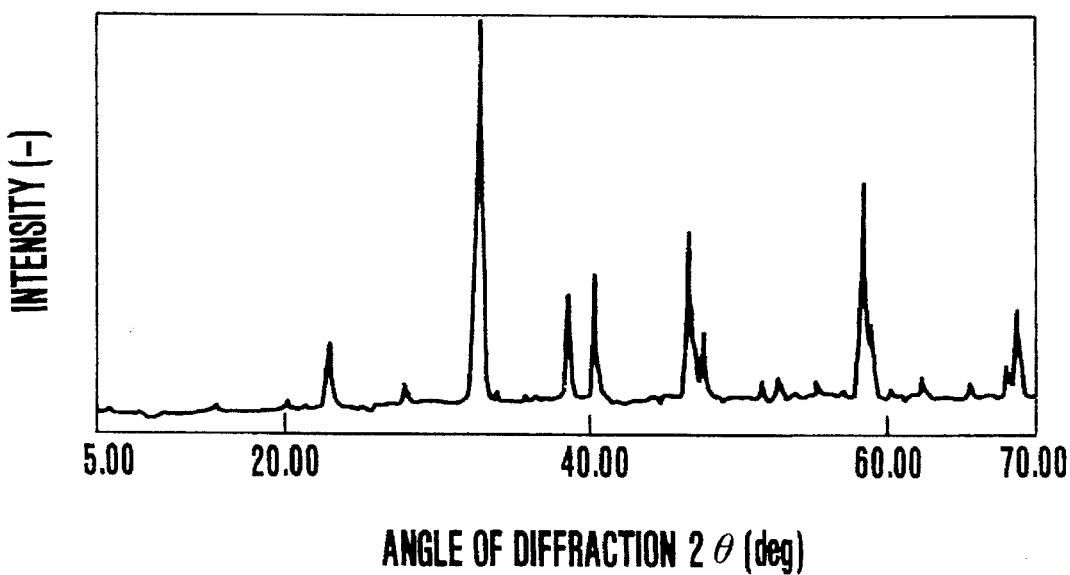

In the following there is described a method of producing Y series oxide superconductors as an example. Powdery raw materials ($Y_2O_3$ for Y, $BaCO_3$ for Ba, CuO for Cu and $K_2CO_3$ for K) were processed in such a manner as mentioned above to prepare a shaped body. This body was observed by an electron microscope (SEM). FIG. 1(a) shows a result of observation. For comparison, FIG. 1(b) shows a result of observation of a body from raw materials free of potassium. The body from the raw materials containing potassium is seen to contain well-grown crystals as compared with the body from the raw materials free of potassium. The X-ray diffraction patterns of the surfaces of the shaped bodies are shown in FIGS. 3(a) and 3(b) for the bodies containing potassium and free of potassium, respectively. The body containing potassium has an X-ray diffraction pattern intensified at (00n) planes. The potassium content of this body is a few percents of the originally incorporated content. This shows that the presence of potassium causes plate-like particles of $YBa_2Cu_3O_{7-\delta}$ to grow in a direction of crystal (a axis-b axis plane) in which electric current can easily flow, and the potassium itself disappears.

Figure 4A:
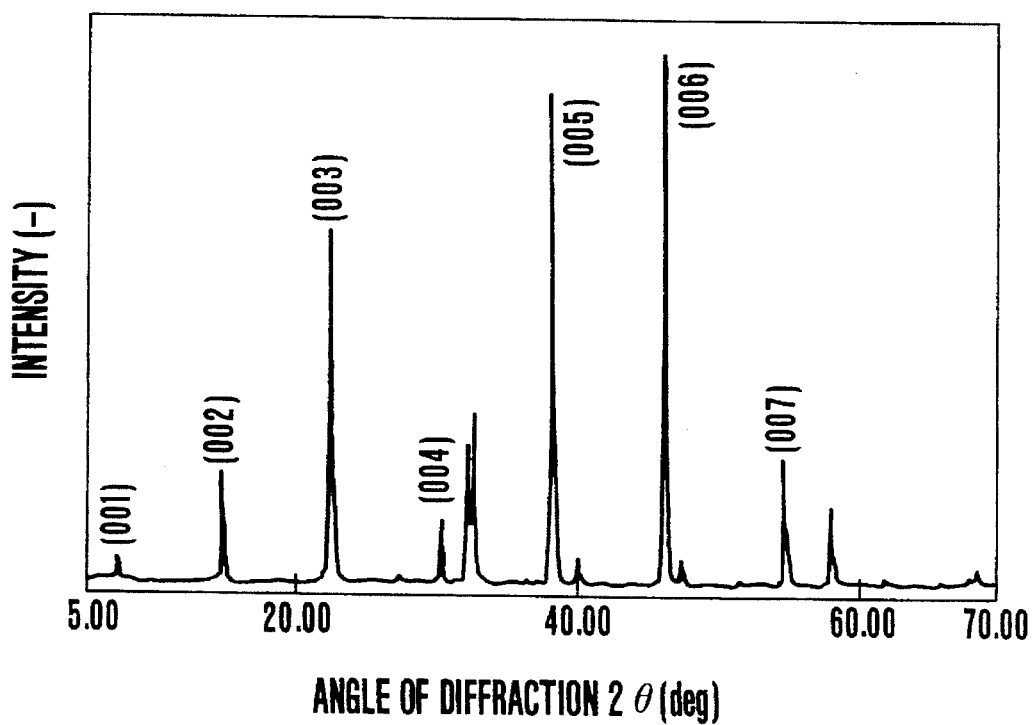
FIGS. 4(a) and 4(b) are X-ray diffraction patterns of the oxide superconducting powdery materials in another example of the present invention and a comparative example, respectively.
Figure 4B:
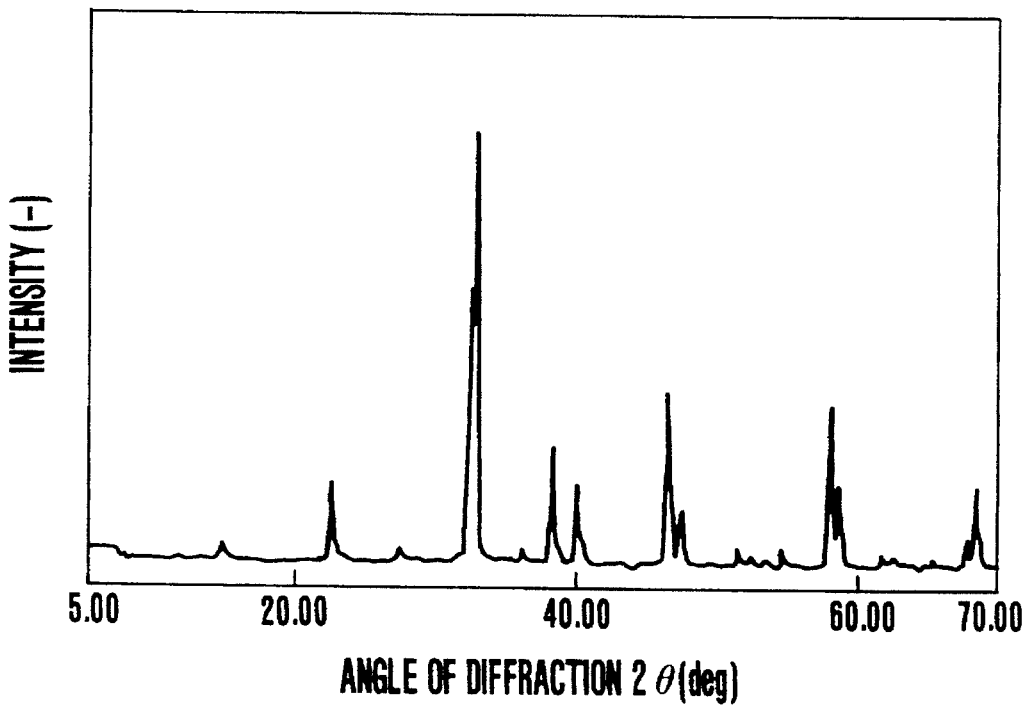

This body is in a shape of flake when cleaved by mechanical pulverization, as is seen from the X-ray diffraction pattern intensified at (00n) plane, as shown in FIG. 4(a) and the electron microphotograph by SEM observation as shown in FIG. 5(a). For comparison, the X-ray diffraction pattern and the SEM photograph of the body free of potassium are shown in FIGS. 4(b) and 5(b), respectively. As is seen from FIGS. 4(b) and 5(b), the body free of potassium contains small sized plate-like particles, which are in an aggregated form. The above-mentioned pulverization may be carried out by various methods with, for example, a grinder (mortar and pestle) or a ball mill. The degree of pulverization is preferably such that the (00n) plane is intensified in the powder X-ray diffraction pattern.

In making a superconducting material from the thus obtained powdery material in, for example, a thin wire or ribbon, a metal pipe is filled with the powdery material (i.e., a superconducting powder containing a) grown crystals and b) potassium), and the pipe is drawn and/or rolled in the wire or ribbon. Furthermore, the powdery material is applied in a form of tape-like film on a substrate and the plate-like particles of the material can be aligned in parallel with the longitudinal direction of the tape-like film by applying a force to the film in a direction normal to the film by rolling, thereby raising up the critical current density ic of the film.

The explanation above refers to the case of potassium but the same explanation can be made with lithium, sodium, rubidium, cesium and bismuth. The heat treating temperature may be not lower than the temperature of decomposing the compound of the above-mentioned element but lower than the temperature of decomposing the oxygen-deficient layer perovskite type structure, i.e., in the range of 400° to 1,100° C., desirably 850° to 1,000° C.

In the above, the detailed explanation was made as to the Y series oxide superconductors, and further this effect by alkali metals was observed in the cases of Bi series and Tl series oxide superconductors.

The methods as mentioned above have the following advantages:

(1) the presence of at least one element selected from the group of alkali metals promotes the crystal growing of plate-like particles in an a axis-b axis plane direction in an oxide superconducting material such as $YBa_2CU_3O_{7-\delta}$, $Bi_2Sr_2Ca_1Cu_2O_8$, $Bi_2Sr_2Ca_2Cu_3O_{10}$, $Tl_2Ba_2Ca_1Cu_2O_8$, $Tl_{2Ba2}Ca_2Cu_3O_{10}$, $Tl_1Ba_2Ca_1Cu_2O_{6.5}$ or $Tl_2Ba_2Ca_2Cu_3O_{8.5}$;

(2) the mechanical pulverization of the superconducting material gives flake-like particles having cleavage at (00n) plane and an excellent alignment of particles in a predetermined direction; and (3) the superconductor having an excellent orientability and a high critical current density can be obtained.

As explained above, according to the present invention, an oxide superconducting material containing crystals grown in a direction of electric current easily flowing, and the oxide superconducting material can be made in flake-like particles by pulverizing, which can easily be aligned in a predetermined direction.

Therefore, the oxide superconductor having a high critical current density ic can be obtained from the oxide superconducting material. Prior techniques of making wires or ribbons are applicable to the superconducting material.

The oxide superconducting material, $LnBa_2CU_3O_x$, such as $Bi_2Sr_2Ca_1Cu_2O_8$, $Bi_2Sr_2Ca_2Cu_3O_{10}$, $Tl_2Ba_2Ca_1Cu_2O_8$, $Tl_2Ba_2Ca_2Cu_3O_{10}$, $Tl_1Ba_2Ca_1Cu_2O_{6.5}$ or $Tl_2Ba_2Ca_2Cu_3O_{8.5}$, may be used singly or in combination with a metal sheath. In the case that the material is in a wire form, it is preferably used in combination with the metal sheath.

When particles are fired, diffusion initially occurs between the particles in contact with each other to thereby allow the particles to bond each other at the contact surfaces thereof. Subsequently, crystal growth takes place while the diffusion goes on. In prior art, the particles are heated to the same temperature as a whole. Therefore, the diffusion occurs throughout the whole of the particles, so that the size of the crygtal grains developed in the fired particles varies depending upon the temperatures and hours used in the firing. In this case, each of the crystal grains is not restrained from growing in arbitrary direction. Therefore, the directions of adjacent crystal grains are entirely disordered.

In accordance with the present invention, the oxide superconducting material is travelled at a low speed through a zone comprising a high-temperature area and a low-temperature area and having a short distance and a great temperature gradient between both the areas, from the high-temperature area to the low-temperature area. The crystal grains go on growing in the travelling direction while the particles are being sintered in the high-temperature area. As a result, the crystal grains can be oriented.

The temperatures of the high-temperature area and the low-temperature area, travelling speed and distance between both the areas have an influence on the crystal growth. In the high temperature area, the particles diffuse each other and high temperatures are required to promote the diffusion. The temperatures are in the range of 850° C. to the melting point of the superconducting material. In the low temperature area, it is required that the diffusion progresses at a very low rate. The temperatures are at the highest 150° C. and should preferably be as low as possible. The travelling speed is an important factor for securing the firing action and the crystal growth. If the speed is too high, continuous crystal growth is prevented. Therefore, it should be at the most 50 mm/hr but it is suitably at least 0.2 mm/hr. If it is lower than 0.2 mm/hr, the effect reaches saturation. The distance between both the areas should not exceed 80 mm, in order that the crystal growth cannot be discontinued.

The resultant crystals may be in a tetragonal form depending upon the cooling rate. In such case, in order to convert the form to a rhombic form, the crystals are required to be heated and anneled in an oxygen atmosphere at temperature of 950° C. or lower to absorb a sufficient amount of oxygen into the crystals, thereby providing the superconducting properties.

In an alternative method of improving the superconducting properties, the present inventors have made a single crystal growing in an a axis-b axis plane direction.

On the other hand, crystal grains oriented in a certain direction may be formed by making a temperature gradient in the melt and cooling the melt in the direction.

The melt may be cooled in a wire shape to make a wire from the melt.

A film of the oxide superconducting material may be formed by dipping a substrate having a higher melting point than the temperature of the melt and less reactivity with the melt.

The temperature of melting the oxide superconducting raw material is required to be in the range of 1,050° to 1,500° C. If the temperature is lower than 1,050° C., only part of the raw material is molten and the amount of the melt is not sufficient to grow the crystals. If the temperature exceeds 1,500° C., the CuO and BaO are decomposed and violently vaporized to deviate the composition from the predetermined one. The melt is cooled at a cooling rate of desirably 1° to 300° C./hr. If the cooling rate is higher than 300° C./hr, the size of crystals is undesirably as small as several to several tens of microns. If the cooling rate is lower than 1° C./hr, it takes too much time, which is not preferred from an industrial point of view.

A source of the alkali metal used herein may preferably be an oxide, chloride, fluid, nitrate, carbonate and etc.

The oxide superconducting material prepared according to the present invention can be used in various applications. For example, the big size single crystal may be formed in a wafer and a high density heat beam is applied onto the wafer to destroy a part of the wafer, thereby forming a wiring pattern on the wafer.

Furthermore, the single crystal according to the present invention may be subjected to a magnetic field to cause the transition from superconduction to normal conduction, thereby making a switching action for a great amount of electric current.

The present invention will be illustrated below with reference some examples and comparative examples. However, the present invention should not be limited to these examples.

Example 1

Figure 6:
FIGS. 6 and 8 are electron microphotographs showing the shape of particles in the oxide superconducting materials in Examples 1 and 3, respectively, according to the present invention.
Figure 7:
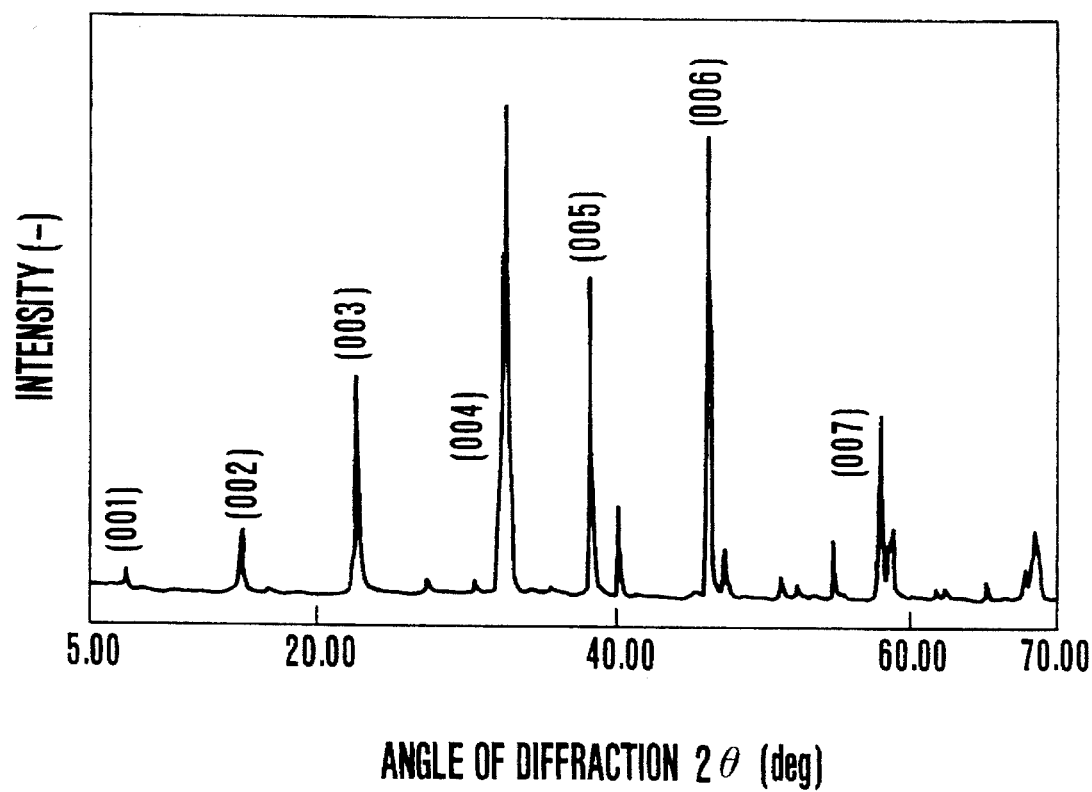
FIGS. 7 and 9 are X-ray diffraction patterns of the oxide superconducting materials of FIGS. 6 and 8, respectively.

16.5 grs of yttrium nitrate $Y(NO_3)_3 \cdot 3H_2O$ and 26.1 grs of barium nitrate $Ba(NO_3)_2$ were dissolved in 2 liters of distilled water. To the resultant solution was added under adequate stirring an aqueous solution of 100 grs of ammonium carbonate dissolved in 1 liter of water through a microtube pump at a rate of 1 liter/hr. The resultant precipitate was subjected to the solid-liquid separation to take a carbonate cake in a grinder (mortar and pestle). To the cake was added 100 ml of a solution containing 36.3 grs of copper nitrate $Cu(NO_3)_3 \cdot 3H_2O$ and 1.02 gr of potassium nitrate. The mixture was heated and kneaded for about 1 hour. The concentrated and kneaded solid was recovered and dried at 130° C. Then, part of the nitrates was decomposed at a temperature of 350° to 400° C. and then the mixture was pelletized in a size of 30 mm in diameter and 3 mm in thickness, prefired at 900° C. for 3 hours and pulverized. This procedure was two times carried out to obtain a black powder, which is hereinafter referred to as powder A. This powder A was pressed at a pressure of 10 tons to make pellets of 30 mm in diameter and 3 mm in thickness. Then, these pellets were fired in an oxygen atmosphere at 920° C. for 5 hours for sintering. These pellets (hereinafter referred to as pellets A) were pulverized by an agate mortar to obtain a powder, which is hereinafter referred to as powder A1. The result of SEM observation of pellets A is shown in FIG. 6. The SEM observation reveals that the plate-like particles were grown in a longitudinal direction in a length of 30 μm or more. The result of X-ray diffraction analysis of powder A' is shown in FIG. 7, from which it is seen that the peaks of (00n) planes are intensified and the crystals were oriented. The potassium content of the powder A' was chemically analyzed to be less than the level which can be quantitatively analyzed. This shows that potassium promoted the crystal growth of the particles.

Example 2

5.7 grs of yttrium oxide, 11.9 grs of copper oxide, 1.1 gr of potassium oxide and 19.7 grs of barium carbonate were well mixed together in an agate mixer (mortar and pestle), pelletized in the same manner as in Example 1, fired at 900° C. for 3 hours and pulverized. This procedure was two times carried out to obtain powder B. This powder was pelletized in the same manner as in Example 1 and fired in an oxygen atmosphere at 950° C. for 5 hours to obtain pellets B. These pellets were pulverized in the same manner as in Example 1 to obtain powder B'. The results of SEM observation of pellets B and X-ray diffraction analysis of powder B' are shown in FIGS. 1(a) and 4(a), respectively. From these figures it is seen that the crystal growth was observed and the X-ray diffraction pattern was intensified at (00n) planes.

Example 3

Figure 8:
Figure 9:
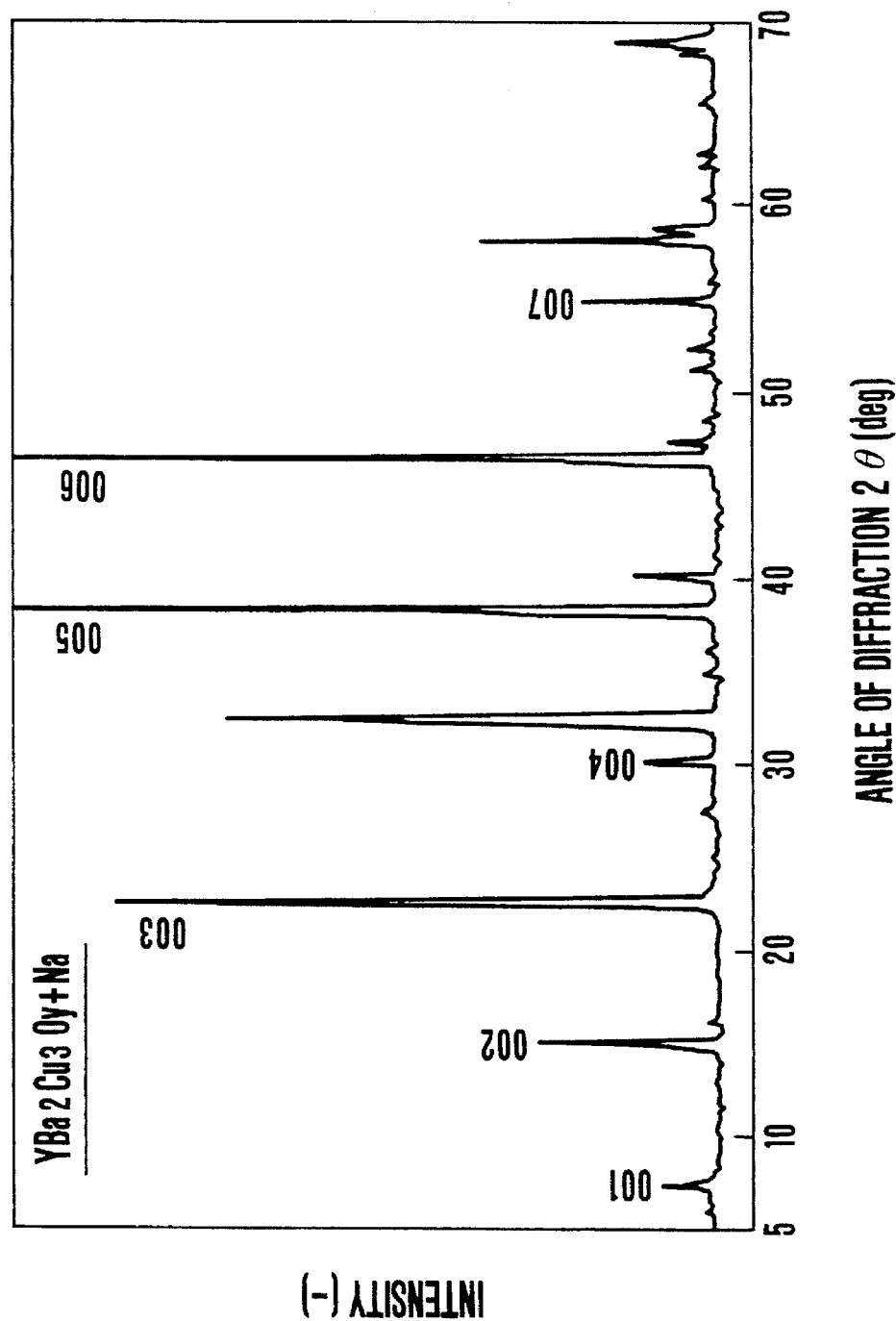

A powdery raw material having a composition free of potassium was heat treated at 900° C. for 3 hours. This procedure was two times carried out. The other procedure was carried out in the same manner as in Example 1 to obtain powder C. Then, the powder was pelletized at a pressure of 10 tons in a size of 30 mm in diameter and 3 mm in thickness. These pellets were put in an aqueous solution of 1 gr of sodium nitrate dissolved in 10 ml of water for 1 minutes under vacuum, thereby impregnating these pellets with the aqueous solution. After drying, these pellets were fired in oxygen at 920° C. for 5 hours to obtain the sintered pellets C. These pellets were pulverized in the same manner as in Example 1 to obtain powder C'. The results of SEM observation and X-ray diffraction analysis are shown in FIGS. 8 and 9 revealing that the crystals were grown and the (00n) planes were developed.

Example 4

A powdery raw material free of potassium was heat treated in the same manner as in Example 3 to obtain powder D. Then, 1.1 gr of potassium carbonate was well mixed with the mixture. Part of the mixture was pelletized at a pressure of 10 tons in a size of 30 mm in diameter and 3 mm in thickness. The pellets were fired in oxygen at 920° C. for 10 hours to obtain sintered pellets D. These pellets were pulverized in the same manner as in Example 3 to obtain powder D'. The results of SEM observation and X-ray diffraction analysis reveal that the crystals were grown and the (00n) planes were developed.

Comparative Example 1

A raw material having a composition free of potassium was treated in the same manner as in Example 1 to obtain pellets E and powder E'. Furthermore, another raw material having a composition free of potassium were treated in the same manner as in Example 1 to obtain pellets F and powder F'. The result of SEM observation of the pellets F is shown in FIG. 1(b). This reveals that the crystals were less grown. The result of X-ray diffraction analysis of powder F is shown in FIG. 4(a), which reveals that there are no peaks of (00n) planes. Furthermore, the same SEM observation and X-ray diffraction pattern were obtained for pellets E and powder E'.

Example 5

The same procedure as in Example 2 was carried out obtain powder B, except that a raw material having a composition free of potassium was fired at 900° C. for 3 hours and pelletized in a powdery form. Then, part of the powder was pelletized at a pressure of 10 tons in pellets of 30 mm in diameter and 3 mm in thickness. These pellets were dipped in an aqueous solution of 2 grs of potassium carbonate dissolved in 10 ml of water and the pellets were impregnated with the solution for 1 minute. After drying, these pellets were fired in oxygen at 950° C. for 10 hours to obtain sintered pellets G. The SEM observation and X-ray diffraction analysis of powder G' made in the same manner as in Example 2 revealed that the crystals were grown at (00n) planes.

Example 6

Powder B was obtained in the same manner as in Example 5. To the powder B was added 1.1 gr of potassium carbonate, which was well mixed. Then, the powder was pelletized in pellets of 30 mm in diameter and 3 mm in thickness. These pellets were fired in oxygen at 950° C. for 10 hours to obtain sintered pellets H. The SEM observation and X-ray diffraction analysis of powder H' made in the same manner as in Example 2 revealed that the crystals were grown at (00n) planes.

Example 7

Figure 10A:
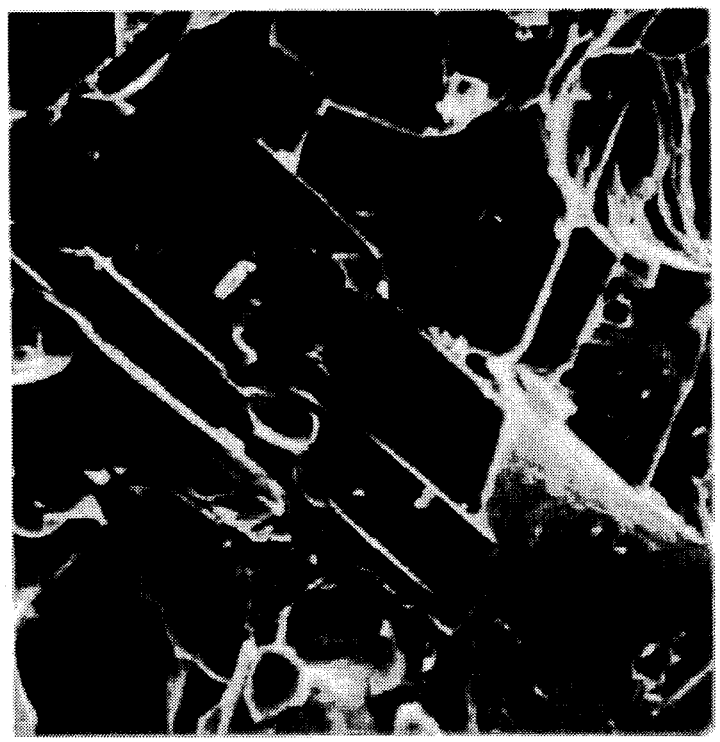
FIGS. 10(a), 10(b) and 10(c) are electron microphotographs showing the shape of particles in the shapea articles made of the oxide superconducting materials according to Example 7 according to the present invention.
Figure 10B:
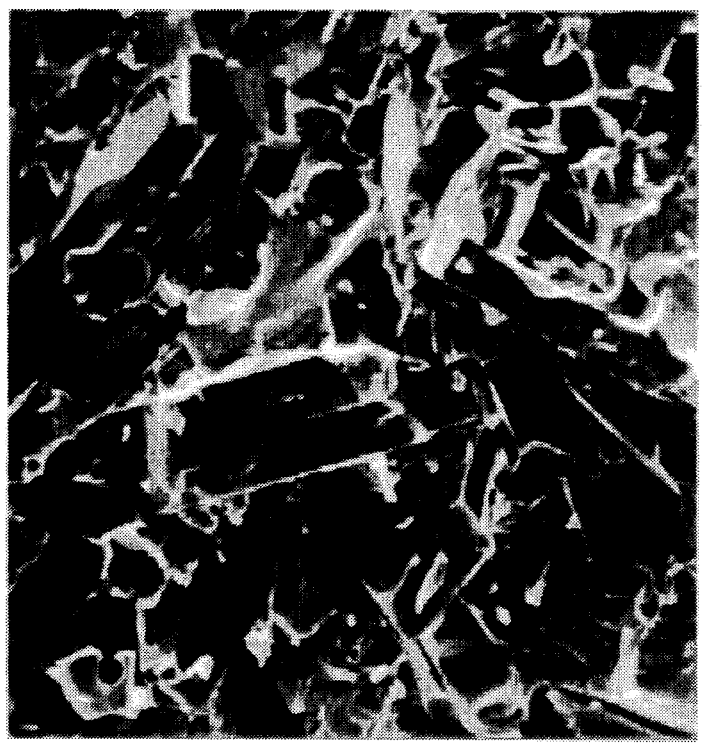
Figure 10C:
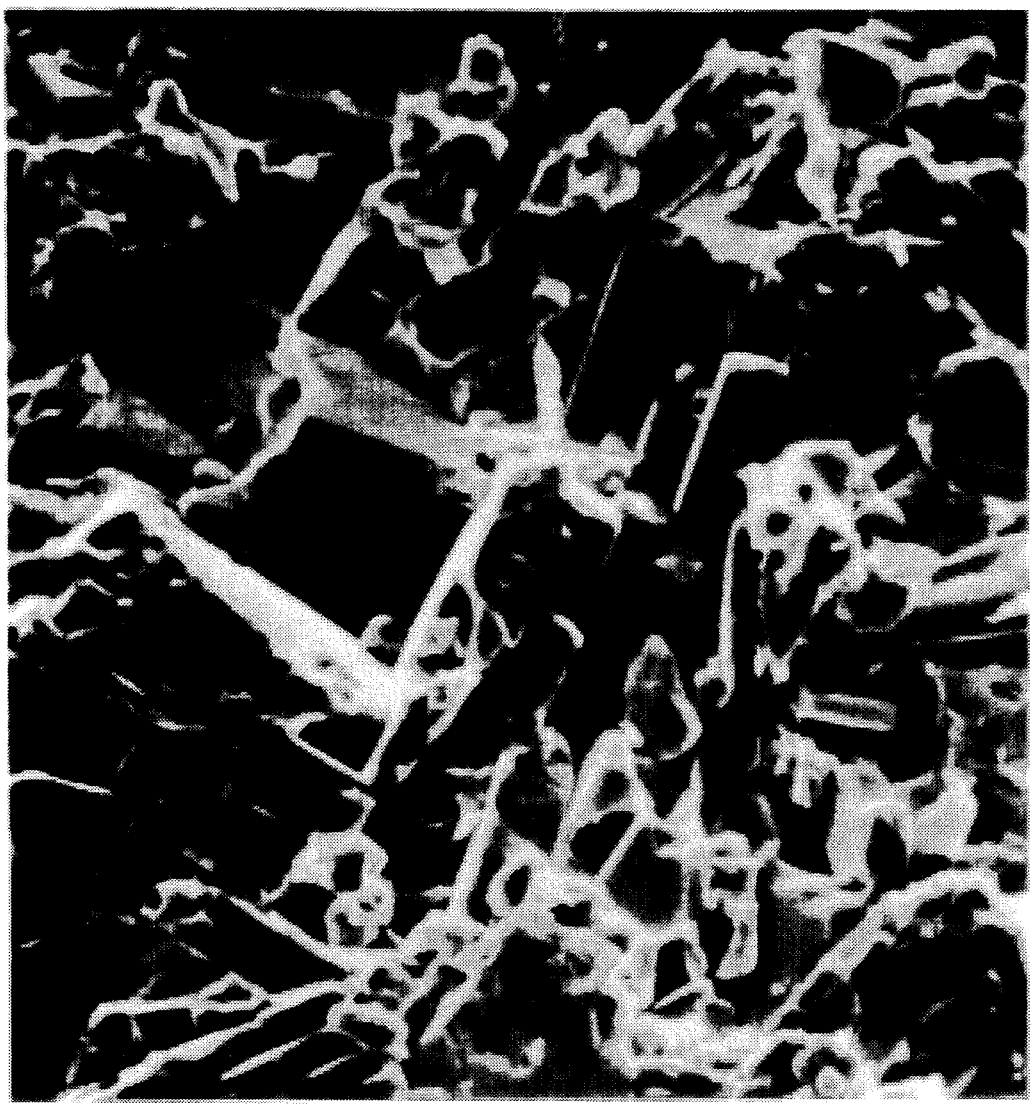

The procedure of Example 2 was repeated, except that carbonates of lithium, rubidium and cesium were substituted for potassium carbonate, to obtain sintered pellets I, J and K, respectively. The SEM microphotographs of these pellets I, J and K are shown in FIGS. 10(a), 10(b) and 10(c), respectively. In all the cases, it is seen that the crystals were better grown than those in Comparative Example 1.

In case of Li doping, there was observed crystal growth; however, there was also observed a decrease in critical temperature, i.e. from 94 K to 85 K. It was discovered that Li atoms were dissolved in the crystal lattice because of its small atomic diameter. This dissolution may cause the decrease in Tc.

Example 8

Pellets A, pellets B, pellets C, pellets D, pellets E, pellets F, pellets G and pellets H each was cut in a size of 2 mm×20 mm×1 mm. The critical temperature Tc onset and critical current density Jc at 77 K were determined by a usual four-terminal resistance method. The results are shown in Table 1.

TABLE 1

| Sample | Tc onset | Jc at 77 K |
| --- | --- | --- |
| Pellets A | 94 K | 1,610 A/cm$^2$ |
| Pellets B | 93 K | 1,400 A/cm$^2$ |
| Pellets C | 94 K | 1,750 A/cm$^2$ |
| Pellets D | 94 K | 1,680 A/cm$^2$ |
| Pellets E | 93 K | 330 A/cm$^2$ |
| Pellets F | 94 K | 430 A/cm$^2$ |
| Pellets G | 94 K | 1,700 A/cm$^2$ |
| Pellets H | 94 K | 1,690 A/cm$^2$ |

Example 9

A silver pipe having an inner diameter of 6 mm was filled with powder A' and drawn in a wire of 1.2 mm in diameter. The drawn wire was cold rolled to form a tape-like wire of 0.2 mm in thickness. The tape was fired in oxygen at 925° C. for 20 hours and slowly cooled to room temperature to obtain a superconducting wire. The critical current density Jc was determined at the temperature of liquid nitrogen (77 K) and an external magnetic field of 0 tesra. The Jc was 15,000 A/cm$^2$.

Example 10

The procedure of Example 9 was repeated, except that powder C' and powder D' were used. Wires were made from the powders and determined for ic. The Jc was 14,500 A/cm$^2$ for powder C' and 17,500 A/cm$^2$ for powder D'.

Example 11

Powder A' powder C' and powder D' were pelletized in pellets of 30 mm in diameter and 3 mm in thickness. Each of these powders were impregnated with a 20 wt % aqueous solution of potassium carbonate under vacuum. After drying, the pellets were fired at 500° C. for about 1 hour. Then, these pellets were pulverized in a grinder (mortar and pestle) to obtain powder A", 25 powder C" and powder D". Wires were made from powder A", powder C" and Powder D" and determined for Jc in the same manner as in Example 9. The wires using powder A", powder C" and powder D" had Jc of 30,100 A/cm$^2$, 31,000 A/cm$^2$ and 29,800 A/cm$^2$.

Example 12

Powder B' and a silver-palladium alloy pipe were used to obtain a tape-like wire in the same manner as in Example 9. Then, the wire was fired in oxygen at 950° C. for 20 hours and cooled to room temperature. The Jc of the wire was determined in the same manner as in 10 Example 8. The Jc was 20,700 A/cm$^2$.

Example 13

The procedure of Example 12 was repeated, except that powder G' and powder H' were used, to make a wire, which was determined for Jc. The Jc was 21,500 A/cm$^2$ for powder G' and 19,900 A/cm$^2$ for powder H'.

Example 14

Powder B", powder G" and powder H" were obtained in the same manner as in Example 11 using powder B', powder G' and powder H'. Tape-like wires were made from these powders. The Jc of these tapes were determined. The Jc was 32,000 A/cm$^2$ for powder B" and 31,000 A/cm$^2$ for powder H".

Example 15

Tape-like wires were made using powder B", powder G" and powder H" of Example 14 in the same manner as in Example 12. The Jc of each powder was determined. The Jc was 35,000 A/cm$^2$ for powder B", 34,500 A/cm$^2$ for powder G" and 35,500 A/cm$^2$ for powder H".

Comparative Example 2

Superconducting wires were made using powders E' and F' in the same manner as in Example 9. The Jc was determined. It was 2,600 A/cm$^2$ for powder E' and 3,300 A/cm$^2$ for powder F'.

Comparative Example 3

A wire was made using powder F' in the same manner as in Example 9. The Jc was determined to be 3,600 A/cm$^2$.

Example 16

Figure 11:
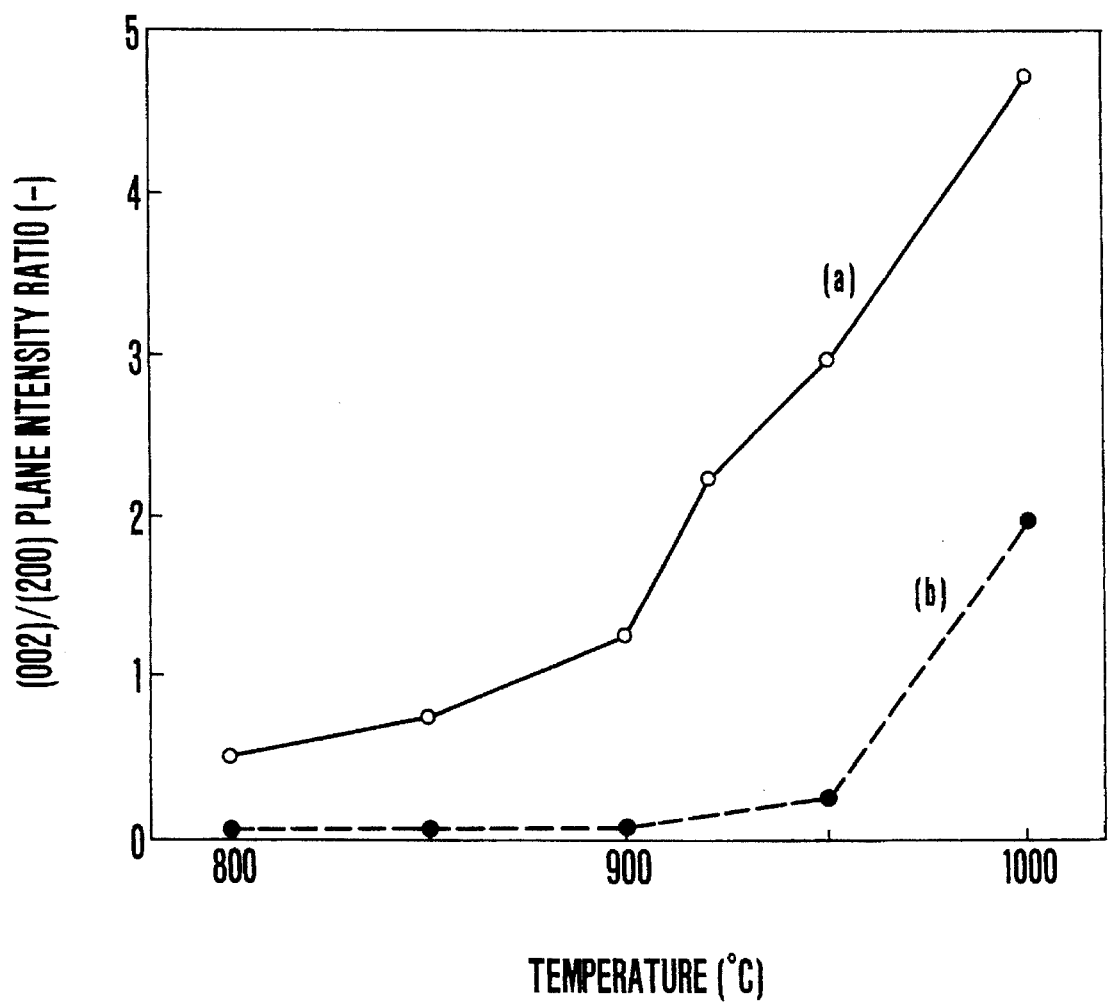
FIG. 11 is a graph showing a relationship between the firing temperature and the diffraction intensity (002)/(200) ratio in the X-ray diffraction pattern.

Sintered pellets were obtained in the same manner as in Example 1, except that the temperatures of firing in oxygen were 800°, 850°, 900°, 920°, 950° and 1,000° C. These pellets were pulverized and subjected to X-ray diffraction analysis. The (002)/(200) intensity ratio was calculated in the X-ray diffraction pattern. In FIG. 11, diffraction peaks of (002) plane and (200) plane do not overlap the peaks of the other planes. The greater the (002)/(200) ratio is, the better the orientability of crystals. The relationship between the (002)/(200) ratio and the firing temperature is shown with curve (a) in FIG. 11. It is seen that the materials having Tc onset of 90 K or higher were obtained when fired at a temperature of 850° to 1,000° C.

Comparative Example 4

The composition (free of potassium) of Comparative Example 1 was subjected to the same experiment as in Example 16. The result is indicated with curve (b) in FIG. 11. It is seen that the materials having Tc onset of 90 K or higher were 10 obtained when fired at a temperature of 850° to 950° C.

Example 17

5.7 grs of yttrium oxide, 11.9 grs of copper oxide, 19.7 grs of barium carbonate, 2.7 grs of bismuth oxide and 0.8 gr of potassium carbonate were mixed in a mixer (mortar and pestle) and pelletized to form pellets of 30 mm in diameter and 3 mm in thickness and fired at 900° C. for 3 hours and then pulverized. The resultant powder were pelletized and fired in oxygen at 930° C. for 5 hours. The resultant pellets were pulverized in the same manner as in Example 1. The resultant powder was subjected to SEM observation and X-ray diffraction analysis. The crystal growth and the pattern intensified at (00n) planes were found. The superconducting properties were determined by a usual four-terminal resistance method. Tc onset was 93 K and Jc was 1,720 A/cm$^2$ at 77 K.

Figure 12:
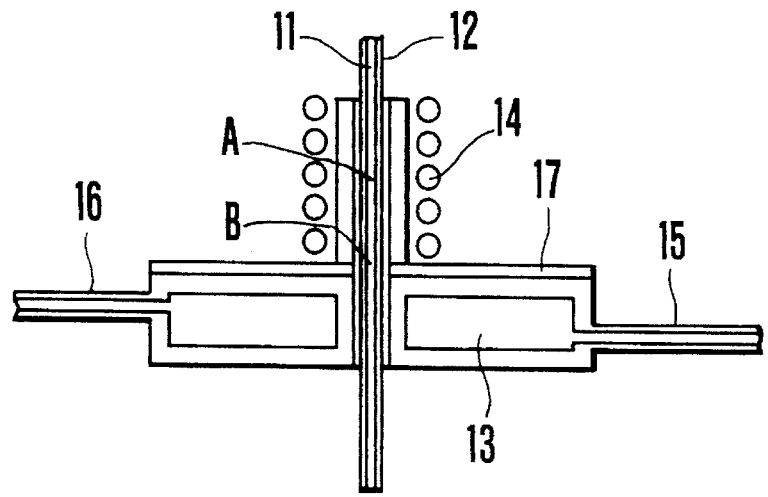
FIG. 12 is a front cross-sectional view of an apparatus used in an embodiment of the present invention.

FIG. 12 shows a schematical front cross-sectional view of an apparatus used-for making a high-temperature oxide superconducting material containing oriented crystals. In this figure, 11 is a hightemperature oxide superconducting material, 12 a metal sheath, 13 a low-temperature area, 14 a high-temperature area, 15 and 16 an inlet and outlet for cooling water and 17 a heat insulator. A is an area at the maximum temperature and B an area at the minimum temperature. A distance between A and B is about 80 mm or less.

The high-temperature oxide superconducting material 11 was prepared in the following manner. A raw material adjusted to a composition of $YBa_2Cu_3O_{2-\delta}$ by solid-phase reaction was pulverized by a centrifugal ball mill for 24 hours to obtain a powder of 1.2 μm in average particle size. This powder was charged into a silver-made pipe of 6 mm in outer diameter and 0.5 mm in thickness to give a density of 2.7 grs/cm$^3$ to the charged powder. The pipe was sealed at the ends thereof, drawn by a drawbench to a wire of 2.8 mm in diameter and rolled through a roller to form a tape of 0.05 mm in thickness. This tape was subjected to the crystal-orientation treatment under the following conditions with the apparatus shown in FIG. 1. That is, the temperatures used were 920° C. in the high-temperature area and 80° C. in the low-temperature area. The sample-travelling rate was 10 mm/hr. The distance between both the areas was 70 mm. The thus obtained sample was then fired in oxygen at 920° C. for 20 hours at a heating rate of 200° C./hr and cooled at a cooling rate of 200° C./hr. This sample is hereinafter referred to as Sample L.

Comparative Example 5

In this experiment, the same power as used in the above experiment was used to make a tap of 0.05 mm in thickness. This tape was heat treated in oxygen at 920° C. for 20 hours at a heating rate of 200° C./hr and cooled at a cooling rate of 200° C./hr without the crystal-orientation treatment. The thus obtained sample is referred to as Sample M.

Figure 13:
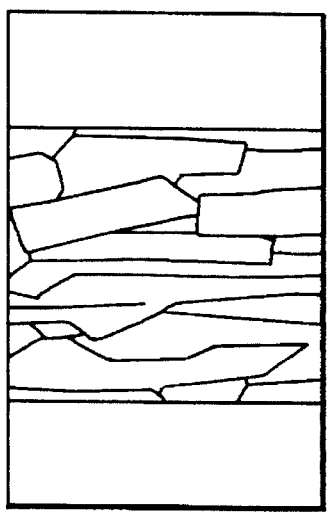
FIG. 13 is a schematical view illustrating the cross-sectional structure of Sample A in Example 9.
Figure 14:
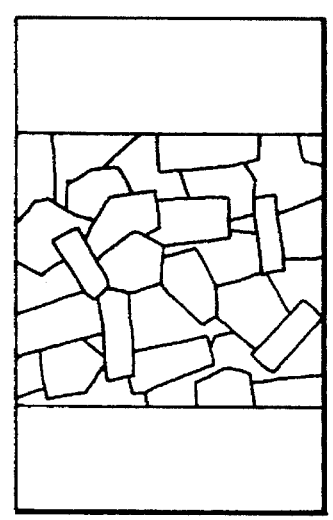
FIG. 14 is a schematical view illustrating the cross-sectional structure of Sample B in Comparative Example 6.
Figure 15:
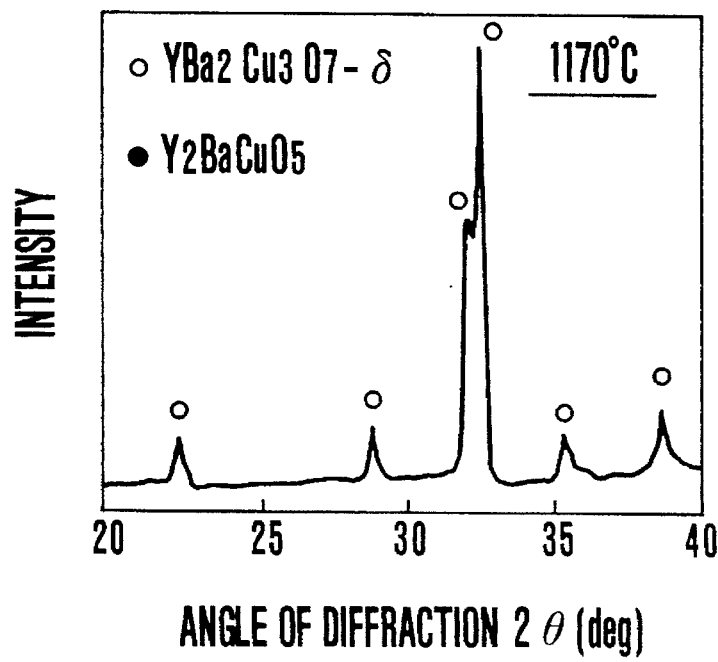
FIGS. 15 and 16 are X-ray patterns of samples obtained by the melting method according to the present invention.
Figure 16:
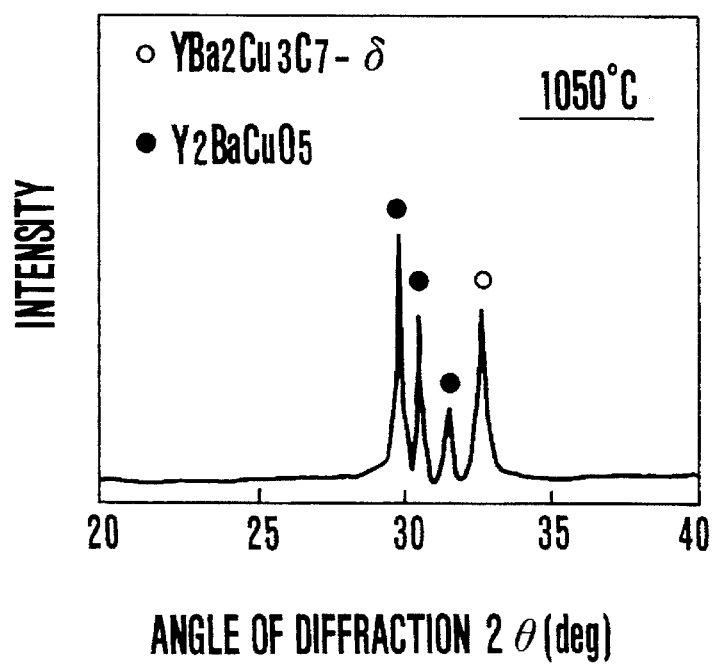

FIGS. 13 and 14 are schematical views showing the cross-sectional tissues of Samples L and M, respectively. It is seen that Sample J made according to the present invention contains crystal grains oriented to the sample-travelling direction, Sample J made by the prior method contains crystal grains getting at random all directions. Furthermore, the crystal size of Sample J was greater than that of Sample M.

The SEM observation on the fractures of Samples L and M was made. In the crystal grains of Sample J were observed stripe-patterned twins which were generated when transformed from tetragonal system to rhombic system during the cooling step after the heat treatment at 920° C. for 20 hours. However, in Sample J, the twins were generated in the same direction between 20 the adjacent grains. On the other hand, in Sample M was not observed such stripe-patterned twins.

The critical current density Jc was determined in liquid nitrogen by a usual four-terminal method. A distance between voltage terminals was 10 mm. When a voltage between the terminals reached 1 μV, a current value was determined. This current value was divided by a cross-sectional surface area of the sample rectangular to the current-flowing direction to obtain the critical current density Jc. The cross-sectional surface area was determined by an optical microscope. The critical current densities Jc of Samples L and M are shown in Table 2.

TABLE 2

| Sample | Critical current density (A/cm$^2$) |
| --- | --- |
| L | 8,300 |
| M | 2,500 |

From Table 2 it is seen that Sample I reached a Jc of 8,300 A/cm$^2$, whereas Sample J had a Jc of 2,500 A/cm$^2$ which is one-third of that of Sample I.

Example 18

16.70 grams of thallium oxide ($Tl_2O_3$), 15.51 grams of barium carbonate, 7.87 grams of calcium carbonate, 9.38 grams of copper oxide (CuO) and 0.54 grams of potassium carbonate were fully mixed in an agate-made mixer (mortar and pestle) and formed in a pellet of 30 mm in diameter and 3 mm in thickness. The pellet was prefired at 800° C. for 3 hours and then pulverized. The resultant powder was pelletized and fired at 830° C. for 10 hours. These pellets were pulverized in such a manner as in Example 1. The SEM observation and X-ray diffraction analysis revealed that the crystals were grown and the peak of (00n) planes were intensified. The ICP quantitative analysis of a quantity of potassium retained revealed that it was in a trace amount. From this it was found that potassium had an effect of promoting the crystal growth even in the Tl series oxide.

The pellet above was cut in a size of 2 mm×20 mm×1 mm and subjected to the measurements with the four-terminal resistance method for the critical temperature Tc and the critical current density Jc at 77 k. $Tc_{onset}$ was 110 K and Jc 25,000 A/cm$^2$.

Example 19

19.44 grams of thallium oxide ($Tl_2O_3$), 18.06 grams of barium carbonate, 4.58 grams of calcium carbonate, 7.28 grams of copper oxide (CuO) and 0.63 grams of potassium carbonate were fully mixed in an agate-made mixer (mortar and pestle) and formed in a pellet of 30 mm in diameter and 3 mm in thickness. The pellet was prefired at 800° C. for 3 hours and then pulverized. The resultant powder was pelletized and fired at 830° C. for 10 hours. These pellets were pulverized in such a manner as in Example 1. The SEM observation and X-ray diffraction analysis revealed that the crystals were grown and the peak of (00n) planes were intensified.

The pellet above was cut in a size of 2 mm×20 mm×1 mm and subjected to the measurements with the four-terminal resistance method for the critical temperature Tc and the critical current density Jc at 77 K. $Tc_{onset}$ was 108 K and Jc 23,000 A/cm$^2$.

Example 20

12.07 grams of thallium oxide ($Tl_2O_3$), 22.42 grams of barium carbonate, 5.69 grams of calcium carbonate, 9.04 grams of copper oxide (CuO) and 0,79 grams of potassium carbonate were fully mixed in an agate-made mixer (mortar and pestle) and formed in a pellet of 30 mm in diameter and 3 mm in thickness. The pellet was prefired at 800° C. for 3 hours and then pulverized. The resultant powder was pelletized and fired at 830° C. for 10 hours. These pellets were pulverized in such a manner as in Example 1. The SEM observation and X-ray diffraction analysis revealed that the crystals were grown and the peak of (00n) planes were intensified.

The pellet above was cut in a size of 2 mm×20 mm×1 mm and subjected to the measurements with the four-terminal resistance method for the critical temperature Tc and the critical current density Jc at 77 K. $Tc_{onset}$ was 78 K and Jc 2,000 A/cm².

Example 21

10.02 grams of thallium oxide ($Tl_2O_3$), 18.62 grams of barium carbonate, 9.44 grams of calcium carbonate, 11.26 grams of copper oxide (CuO) and 0.65 grams of potassium carbonate were fully mixed in an agate-made mixer (mortar and pestle) and formed in a pellet of 30 mm in diameter and 3 mm in thickness. The pellet was prefired at 800° C. for 3 hours and then pulverized. The resultant powder was pelletized and fired at 830° C. for 10 hours. These pellets were pulverized in such a manner as in Example 1. The SEM observation and X-ray diffraction analysis revealed that the crystals were grown and the peak of (00n) planes were intensified.

The pellet above was cut in a size of 2 mm×20 mm×1 mm and subjected to the measurements with the four-terminal resistance method for the critical temperature Tc and the critical current density Jc at 77 K. $Tc_{onset}$ was 109 K and Jc 25,000 A/cm².

Example 22

11.94 grams of thallium oxide ($Tl_2O_3$), 22.19 grams of barium carbonate, 5.63 grams of calcium carbonate, 8.94 grams of copper oxide (CuO) and 1.30 grams of rubidium carbonate were fully mixed in an agate-made mixer (mortar and pestle) and formed in a pellet of 30 mm in diameter and 3 mm in thickness. The pellet was prefired at 800° C. for 3 hours and then pulverized. The resultant powder was pelletized and fired at 830° C. for 10 hours. These pellets were pulverized in such a manner as in Example 1. The SEM observation and X-ray diffraction analysis revealed that the crystals were grown and the peak of (00n) planes were intensified. The ICP quantitative analysis of a quantity of potassium retained revealed that it was retained in a rubidium-to-thallium atomic ratio of 0.01 to 1. From this it was found that the rubidium had an effect of promoting the crystal growth even in the Tl series oxide.

The pellet above was cut in a size of 2 mm×20 mm×1 mm and subjected to the measurements with the four-terminal resistance method for the critical temperature Tc and the critical current density Jc at 77 K. $Tc_{onset}$ was 80 K and Jc 20,000 A/cm².

Example 23

19.28 grams of thallium oxide ($Tl_2O_3$), 17.91 grams of barium carbonate, 4.54 grams of calcium carbonate, 7.22 grams of copper oxide (CuO) and 1.05 grams of rubidium carbonate were fully mixed in an agate-made mixer (mortar and pestle) and formed in a pellet of 30 mm in diameter and 3 mm in thickness. The pellet was prefired at 800° C. for 3 hours and then pulverized. The resultant powder was pelletized and fired at 830° C. for 10 hours. These pellets were pulverized in such a manner as in Example 1. The SEM observation and X-ray diffraction analysis revealed that the crystals were grown and the peak of (00n) planes were intensified.

The pellet above was cut in a size of 2 mm×20 mm×1 mm and subjected to the measurements with the four-terminal resistance method for the critical temperature Tc and the critical current density Jc at 77 K. $Tc_{onset}$ was 110 K and Jc 25,000 A/cm².

Example 24

16.51 grams of thallium oxide ($Tl_2O_3$), 15.34 grams of barium carbonate, 7.78 grams of calcium carbonate, 9.38 grams of copper oxide (CuO) and 1.10 grams of cesium oxide ($Cs_2O$) were fully mixed in an agate-made mixer (mortar and pestle) and formed in a pellet of 30 mm in diameter and 3 mm in thickness. The pellet was prefired at 800° C. for 3 hours and then pulverized. The resultant powder was pelletized and fired at 830° C. for 10 hours. These pellets were pulverized in such a manner as in Example 1. The SEM observation and X-ray diffraction analysis revealed that the crystals were grown and the peak of (00n) planes were intensified. The ICP quantitative analysis of a quantity of potassium retained revealed that it was retained in a cesium-to-thallium atomic ratio of 0.01 to 2. From this it was found that the cesium had an effect of promoting the crystal growth even in the Tl series oxide.

The pellet above was cut in a size of 2 mm×20 mm×1 mm and subjected to the measurements with the four-terminal resistance method for the critical temperature Tc and the critical current density Jc at 77 K. $Tc_{onset}$ was 124 K and Jc 30,000 A/cm².

Example 25

9.89 grams of thallium oxide ($Tl_2O_3$), 18.37 grams of barium carbonate, 9.32 grams of calcium carbonate, 11.11 grams of copper oxide (CuO) and 1.31 grams of cesium oxide ($Cs_2O$) were fully mixed in an agate-made mixer (mortar and pestle) and formed in a pellet of 30 mm in diameter and 3 mm in thickness. The pellet was prefired at 800° C. for 3 hours and then pulverized. The resultant powder was pelletized and fired at 830° C. for 10 hours. These pellets were pulverized in such a manner as in Example 1. The SEM observation and X-ray diffraction analysis revealed that the crystals were grown and the peak of (00n) planes were intensified.

The pellet above was cut in a size of 2 mm×20 mm×1 mm and subjected to the measurements with the four-terminal resistance method for the critical temperature Tc and the critical current density Jc at 77 K. $Tc_{onset}$ was 110 K and Jc 25,000 A/cm².

Example 26

16.74 grams of thallium oxide ($Tl_2O_3$), 15.55 grams of barium carbonate, 7.89 grams of calcium carbonate, 9.40 grams of copper oxide (CuO) and 0.42 grams of sodium carbonate were fully mixed in an agate-made mixer (mortar and pestle) and formed in a pellet of 30 mm in diameter and 3 mm in thickness. The pellet was prefired at 800° C. for 3 hours and then pulverized. The resultant powder was pelletized and fired at 830° C. for 10 hours. These pellets were pulverized in such a manner as in Example 1. The SEM observation and X-ray diffraction analysis revealed that the crystals were grown and the peak of (00n) planes were intensified. The ICP quantitative analysis of a quantity of sodium retained revealed that it was in a trace amount. From this it was found that the sodiumhad an effect of promoting the crystal growth even in the Tl series oxide.

The pellet above was cut in a size of 2 mm×20 mm×1 mm and subjected to the measurements with the four-terminal resistance method for the critical temperature Tc and the critical current density Jc at 77 K. $Tc_{onset}$ was 124 K and Jc 39,000 A/cm².

Example 27

22.53 grams of bismuth oxide ($Bi_2O_3$), 14.28 grams of strontium carbonate, 4.84 grams of calcium carbonate, 7.69 grams of copper oxide (CuO) and 0.67 grams of potassium carbonate were fully mixed in an agate-made mixer (mortar and pestle) and formed in a pellet of 30 mm in diameter and 3 mm in thickness. The pellet was prefired at 800° C. for 3 hours and then pulverized. The resultant powder was pelletized and fired at 830° C. for 10 hours. These pellets were pulverized in such a manner as in Example 1. The SEM observation and X-ray diffraction analysis revealed that the crystals were grown and the peak of (00n) planes were intensified. The ICP quantitative analysis of a quantity of potassium retained revealed that it was in a trace amount. From this it was found that the potassium had an effect of promoting the crystal growth even in the Bi series oxide.

The pellet above was cut in a size of 2 mm×20 mm×1 mm and subjected to the measurements with the four-terminal resistance method for the critical temperature Tc and the critical current density Jc at 77 K. $Tc_{onset}$ was 80 K and Jc 25,000 A/cm$^2$.

Example 28

19.19 grams of bismuth oxide ($Bi_2O_3$), 12.16 grams of strontium carbonate, 8.25 grams of calcium carbonate, 9.83 grams of copper oxide (CuO) and 0.57 grams of potassium carbonate were fully mixed in an agate-made mixer (mortar and pestle) and formed in a pellet of 30 mm in diameter and 3 mm in thickness. The pellet was prefired at 800° C. for 3 hours and then pulverized. The resultant powder was pelletized and fired at 830° C. for 10 hours. These pellets were pulverized in such a manner as in Example 1. The SEM observation and X-ray diffraction analysis revealed that the crystals were grown and the peak of (00n) planes were intensified.

The pellet above was cut in a size of 2 mm×20 mm×1 mm and subjected to the measurements with the four-terminal resistance method for the critical temperature Tc and the critical current density Jc at 109 K. $Tc_{onset}$ was 109 K and Jc 35,000 A/cm$^2$.

Example 29

22.33 grams of bismuth oxide ($Bi_2O_3$), 14.15 grams of strontium carbonate, 4.80 grams of calcium carbonate, 7.62 grams of copper oxide (CuO) and 1.11 grams of rubidium carbonate were fully mixed in an agate-made mixer (mortar and pestle) and formed in a pellet of 30 mm in diameter and 3 mm in thickness. The pellet was prefired at 800° C. for 3 hours and then pulverized. The resultant powder was pelletized and fired at 830° C. for 10 hours. These pellets were pulverized in such a manner as in Example 1. The SEM observation and X-ray diffraction analysis revealed that the crystals were grown and the peak of (00n) planes were intensified. The ICP quantitative analysis of a quantity of rubidium retained revealed that it was in a trace amount. From this it was found that rubidium had an effect of promoting the crystal growth even in the Bi series oxide.

The pellet above was cut in a size of 2 mm×20 mm×1 mm and subjected to the measurements with the four-terminal resistance method for the critical temperature Tc and the critical current density Jc at 77 K. $Tc_{onset}$ was 80 K and Jc 24,000 A/cm$^2$.

Example 30

19.05 grams of bismuth oxide ($Bi_2O_3$), 12.07 grams of strontium carbonate, 8.18 grams of calcium carbonate, 9.76 grams of copper oxide (CuO) and 0.94 grams of rubidium carbonate were fully mixed in an agate-made mixer (mortar and pestle) and formed in a pellet of 30 mm in diameter and 3 mm in thickness. The pellet was prefired at 800° C. for 3 hours and then pulverized. The resultant powder was pelletized and fired at 830° C. for 10 hours. These pellets were pulverized in such a manner as in Example 1. The SEM observation and X-ray diffraction analysis revealed that the crystals were grown and the peak of (00n) planes were intensified.

The pellet above was cut in a size of 2 mm×20 mm×1 mm and subjected to the measurements with the four-terminal resistance method for the critical temperature Tc and the critical current density Jc at 109 K. $Tc_{onset}$ was 109 K and Jc 34,000 A/cm$^2$.

Example 31

18.98 grams of bismuth oxide ($Bi_2O_3$), 12.02 grams of strontium carbonate, 8.15 grams of calcium carbonate, 9.72 grams of copper oxide (CuO) and 1.15 grams of cesium oxide (CS20) were fully mixed in an agate-made mixer (mortar and pestle) and formed in a pellet of 30 mm in diameter and 3 mm in thickness. The pellet was prefired at 800° C. for 3 hours and then pulverized. The resultant powder was pelletized and fired at 830° C. for 10 hours. These pellets were pulverized in such a manner as in Example 1. The SEM observation and X-ray diffraction analysis revealed that the crystals were grown and the peak of (00n) planes were intensified. The ICP quantitative analysis of a quantity of cesium retained revealed that it was in a trace amount. From this it was found that rubidium had an effect of promoting the crystal growth even in the Bi series oxide.

The pellet above was cut in a size of 2 mm×20 mm×1 mm and subjected to the measurements with the four-terminal resistance method for the critical temperature Tc and the critical current density Jc at 77 K. $Tc_{onset}$ was 108 K and Jc 29,000 A/cm$^2$.

Example 32

16.74 grams of thallium oxide ($Tl_2O_3$), 15.55 grams of barium carbonate, 7.89 grams of calcium carbonate, 9.40 grams of copper oxide (CuO) and 0.42 grams of sodium carbonate were fully mixed in an agate-made mixer (mortar and pestle) and formed in a pellet of 30 mm in diameter and 3 mm in thickness. The pellet was prefired at 800° C. for 3 hours and then pulverized. The resultant powder was pelletized and fired at 830° C. for 10 hours. These pellets were pulverized in such a manner as in Example 1. The SEM observation and X-ray diffraction analysis revealed that the crystals were grown and the peak of (00n) planes were intensified. The ICP quantitative analysis of a quantity of sodium retained revealed that it was in a trace amount. From this it was found that sodium had an effect of promoting the crystal growth even in the Tl series oxide.

The pellet above was cut in a size of 2 mm×20 mm×1 mm and subjected to the measurements with the four-terminal resistance method for the critical temperature Tc and the critical current density Jc at 124 K. $Tc_{onset}$ was 108 K and Jc 39,000 A/cm$^2$.

Example 33

10.05 grams of thallium oxide ($Tl_2O_3$), 18.68 grams of barium carbonate, 9.47 grams of calcium carbonate, 11.29 grams of copper oxide (CuO) and 0.50 grams of sodium carbonate were fully mixed in an agate-made mixer (mortar and pestle) and formed in a pellet of 30 mm in diameter and 3 mm in thickness. The pellet was prefired at 800° C. for 3 hours and then pulverized. The resultant powder was pelletized and fired at 830° C. for 10 hours. These pellets were pulverized in such a manner as in Example 1. The SEM observation and X-ray diffraction analysis revealed that the crystals were grown and the peak of (00n) planes were intensified.

The pellet above was cut in a size of 2 mm×20 mm×1 mm and subjected to the measurements with the four-terminal resistance method for the critical temperature Tc and the critical current density Jc at 77 K. $Tc_{onset}$ was 110 K and Jc 31,000 A/cm$^2$.

Example 34

19.24 grams of bismuth oxide ($Bi_2O_3$), 12.19 grams of strontium carbonate, 8.27 grams of calcium carbonate, 9.86 grams of copper oxide (CuO) and 0.44 grams of sodium carbonate were fully mixed in an agate-made mixer (mortar and pestle) and formed in a pellet of 30 mm in diameter and 3 mm in thickness. The pellet was prefired at 800° C. for 3 hours and then pulverized. The resultant powder was pelletized and fired at 830° C. for 10 hours. These pellets were pulverized in such a manner as in Example 1. The SEM observation and X-ray diffraction analysis revealed that the crystals were grown and the peak of (00n) planes were intensified. The ICP quantitative analysis of a quantity of sodium retained revealed that it was in a trace amount. From this it was found that rubidium had an effect of promoting the crystal growth even in the Bi series oxide.

The pellet above was cut in a size of 2 mm×20 mm×1 mm and subjected to the measurements with the four-terminal resistance method for the critical temperature Tc and the critical current density Jc at 77 K. $Tc_{onset}$ was 108 K and Jc 39,000 A/cm$^2$.

What is claimed is:

1. A method of producing a high-temperature oxide superconducting material, which comprises the steps of:
    a) preparing a material corresponding to an oxide superconductor of the perovskite type structure consisting essentially of a first member selected from the group consisting of yttrium, lanthanoids, thallium and bismuth; at least one alkaline earth metal; copper; and oxygen; and
    b) heating the material in the presence of 0.01 to 10 moles of a salt of an alkali metal selected from the group consisting of potassium, sodium, rubidium and cesium to a temperature around the melting point of the alkali metal or to a higher temperature for a time sufficient to effect grain growth in the superconductor material, thereby to produce the superconductor containing the alkali metal in an amount not larger than 4 mole % based on the first member.

2. A method according to claim 1, wherein the oxide superconductor material is a member selected from the group consisting of Ln-Ba-Cu oxide, Y-Ba-Cu oxide, Bi-Sr-Ca-Cu oxide and Tl-Ba-Ca-Cu oxide, where Ln means lanthanoids.

3. A method according to claim 2, wherein the oxide superconducting material is a member selected from the group consisting of $YBa_2Cu_3O_{7+\delta}$, $Bi_2Sr_2Ca_1Cu_2O_{8+\delta}$, $Bi_2Sr_2Ca_2Cu_3O_{10+\delta}$, $Tl_2Ba_2Ca_1Cu_2O_{8+\delta}$, $Tl_2Ba_2Ca_2Cu_3O_{10+\delta}$, $Tl_1Ba_2Ca_1Cu_2O_{6.5+\delta}$ and $Tl_2Ba_2Ca_2Cu_3O_{8.5+\delta}$.

4. A method of producing a high-temperature oxide superconducting material, which comprises the steps of:
    a) preparing a mixture of materials corresponding to an oxide superconductor of the perovskite type structure comprising a first member selected from the group consisting of a yttrium compound, a lanthanoid compound, a thallium compound and a bismuth compound; at least one alkaline earth metal compound and a copper compound, and an alkali metal compound selected from the group consisting of a potassium compound, a sodium compound, a rubidium compound and a cesium compound in such an amount that the alkali metal compound is in the range of 0.01 to 10 mols; and
    b) heating the mixture to a temperature so as to convert the mixture into the superconductor of the perovskite type structure consisting essentially of the first member, the at least one alkaline earth metal and copper for a time sufficient to effect grain growth in the superconductor material, thereby to produce the superconductor containing the alkali metal in an amount not larger than 4 mole % based on the first member of the superconductor.

5. A method according to claim 4, wherein the oxide superconductor material is a member selected from the group consisting of La-Sr-Cu oxide, Y-Ba-Cu oxide, Bi-Sr-Ca-Cu oxide and Tl-Ba-Ca-Cu oxide.

6. A method according to claim 5, wherein the oxide superconductor material is a member selected from the group consisting of $YBa_2Cu_3O_{7+\delta}$, $Bi_2Sr_2Ca_1Cu_2O_{8+\delta}$, $Bi_2Sr_2Ca_2Cu_3O_{10+\delta}$, $Tl_2Ba_2Ca_1Cu_2O_{8+\delta}$, $Tl_2Ba_2Ca_2Cu_3O_{10+\delta}$, $Tl_1Ba_2Ca_1Cu_2O_{6.5+\delta}$ and $Tl_2Ba_2Ca_2Cu_3O_{8.5+\delta}$.

7. A method according to claim 1, wherein the heating is conducted until the crystals grow to the longitudinal length of 30 μm or more.

8. A method according to claim 4, wherein the heating is conducted until the crystals grow to the longitudinal length of 30 μm or more.

9. A method according to claim 1, which further comprises the steps of:
    pulverizing the resulting superconductor material having been subjected to the heat treatment in the presence of the alkali metal;
    packing the resulting powder of the superconductor in a hollow of a electrical conductor material;
    drawing the packed superconductor together with the tube thereby to reduce the sectional area of the tube and to enlarge its length; and
    firing the resulting composite of the superconductor and the electrical conductor material.

10. A method according to claim 4, which further comprises the steps of:
    pulverizing the resulting superconductor material having been subjected to the heat treatment in the presence of the alkali metal;
    packing the resulting powder of the superconductor in a hollow of a electrical conductor material;
    drawing the packed superconductor together with the tube thereby to reduce the sectional area of the tube and to enlarge its length; and
    firing the resulting composite of the superconductor and the electrical conductor material.

* * * * *